United States Patent
Chen et al.

(10) Patent No.: US 11,476,201 B2
(45) Date of Patent: Oct. 18, 2022

(54) PACKAGE-ON-PACKAGE DEVICE

(71) Applicant: Taiwan Semiconductor Manufacturing Company, Ltd., Hsinchu (TW)

(72) Inventors: Ming-Fa Chen, Taichung (TW); Sung-Feng Yeh, Taipei (TW); Hsien-Wei Chen, Hsinchu (TW)

(73) Assignee: TAIWAN SEMICONDUCTOR MANUFACTURING COMPANY. LTD., Hsinchu (TW)

( * ) Notice: Subject to any disclaimer, the term of this patent is extended or adjusted under 35 U.S.C. 154(b) by 0 days.

(21) Appl. No.: 16/823,655

(22) Filed: Mar. 19, 2020

(65) Prior Publication Data
US 2021/0098380 A1    Apr. 1, 2021

Related U.S. Application Data

(60) Provisional application No. 62/906,943, filed on Sep. 27, 2019.

(51) Int. Cl.
*H01L 23/538* (2006.01)
*H01L 23/00* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 23/5389; H01L 23/5383; H01L 23/5386; H01L 23/3128; H01L 23/642;
(Continued)

(56) References Cited

U.S. PATENT DOCUMENTS 8,987,922 B2   3/2015   Yu et al.
8,993,380 B2   3/2015   Hou et al.
(Continued)

FOREIGN PATENT DOCUMENTS

KR    20160063241 A    6/2016
KR    20180030147 A    3/2018
WO    2017034654 A1    3/2017

*Primary Examiner* — Kyoung Lee
*Assistant Examiner* — Christina A Sylvia
(74) *Attorney, Agent, or Firm* — Slater Matsil, LLP

(57) ABSTRACT

A package includes a redistribution structure, a die package on a first side of the redistribution structure including a first die connected to a second die by metal-to-metal bonding and dielectric-to-dielectric bonding, a dielectric material over the first die and the second die and surrounding the first die, and a first through via extending through the dielectric material and connected to the first die and a first via of the redistribution structure, a semiconductor device on the first side of the redistribution structure includes a conductive connector, wherein a second via of the redistribution structure contacts the conductive connector of the semiconductor device, a first molding material on the redistribution structure and surrounding the die package and the semiconductor device, and a package through via extending through the first molding material to contact a third via of the redistribution structure.

20 Claims, 28 Drawing Sheets

(51) Int. Cl.
*H01L 25/10* (2006.01)
*H01L 21/48* (2006.01)
*H01L 21/56* (2006.01)
*H01L 21/683* (2006.01)
*H01L 21/78* (2006.01)
*H01L 25/00* (2006.01)
*H01L 23/31* (2006.01)

(52) U.S. Cl.
CPC .......... *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 24/08* (2013.01); *H01L 24/80* (2013.01); *H01L 25/105* (2013.01); *H01L 25/50* (2013.01); *H01L 2221/68372* (2013.01); *H01L 2224/08145* (2013.01); *H01L 2224/80895* (2013.01); *H01L 2224/80896* (2013.01); *H01L 2225/1035* (2013.01); *H01L 2225/1058* (2013.01)

(58) Field of Classification Search
CPC .................. H01L 23/647; H01L 23/495; H01L 23/49827; H01L 23/525; H01L 23/532; H01L 24/08; H01L 24/80; H01L 24/18; H01L 25/105; H01L 25/50; H01L 25/117; H01L 21/4853; H01L 21/4857; H01L 21/565; H01L 21/568; H01L 21/6835; H01L 21/78; H01L 2225/1035; H01L 2225/1058; H01L 2225/0657; H01L 2225/0651; H01L 2225/06568; H01L 2221/68372; H01L 2221/68381; H01L 2221/68354; H01L 2221/68345; H01L 2221/68359; H01L 2221/68327; H01L 2224/08145; H01L 2224/80895; H01L 2224/80896; H01L 2224/18

See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,373,605 B1 * | 6/2016 | Wang | H01L 23/5385 |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 * | 8/2017 | Su | H01L 25/0657 |
| 10,679,947 B2 * | 6/2020 | Wang | H01L 24/19 |
| 2008/0246126 A1 * | 10/2008 | Bowles | H01L 25/50 257/659 |
| 2014/0252646 A1 * | 9/2014 | Hung | H01L 24/81 257/774 |
| 2016/0148903 A1 | 5/2016 | Su et al. | |
| 2018/0033771 A1 * | 2/2018 | Yu | H01L 23/3114 |
| 2019/0109083 A1 | 4/2019 | Yu et al. | |
| 2019/0148342 A1 | 5/2019 | Hu et al. | |
| 2019/0244947 A1 | 8/2019 | Yu et al. | |
| 2020/0135594 A1 * | 4/2020 | Lee | G01R 31/2884 |

* cited by examiner

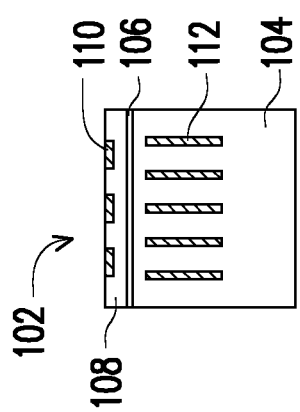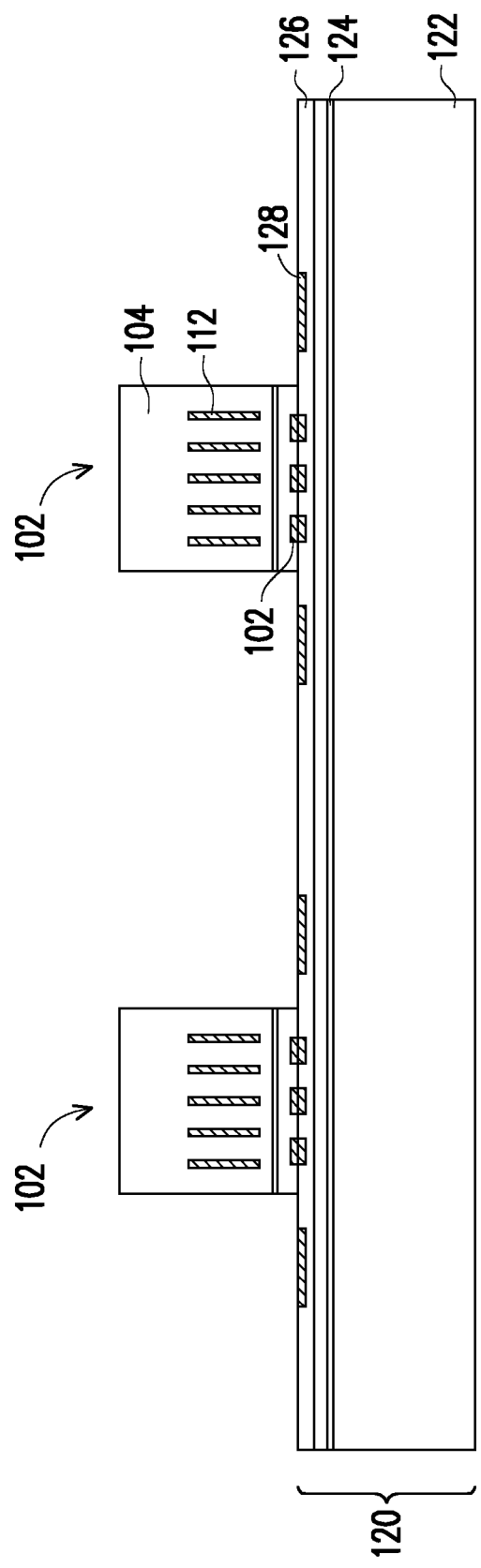

PACKAGE-ON-PACKAGE DEVICE

PRIORITY CLAIM AND CROSS-REFERENCE

This application claims the benefit of U.S. Provisional Application No. 62/906,943, filed on Sep. 27, 2019, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 6 illustrate cross-sectional views of intermediate steps during a process for forming a die package, in accordance with some embodiments.

DETAILED DESCRIPTION

Figure 1:
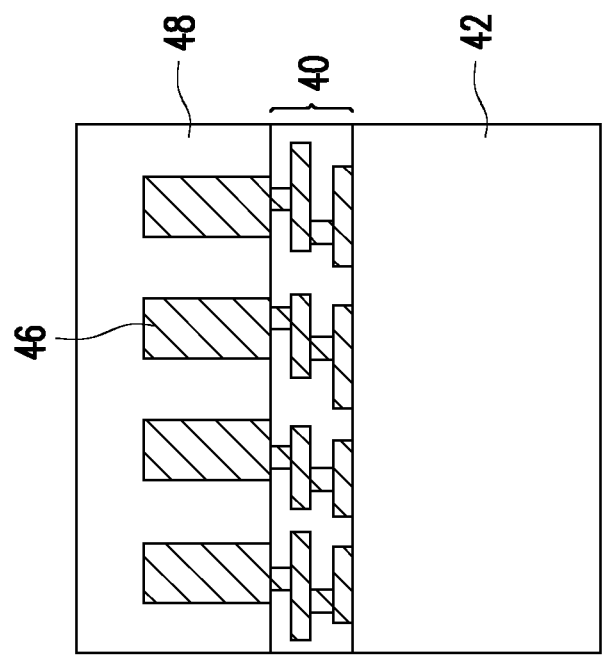
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a system-on-a-chip ("SoC") along with an integrated fan out package. However, embodiments are not intended to be limited, and may be employed in a wide variety of embodiments. In some embodiments, a die package is formed that includes multiple dies bonded together. The dies may be bonded together using hybrid bonding, for example. The die package may include through substrate vias and/or through dielectric vias. A package may be formed incorporating the die package in addition to another semiconductor device, such as a memory die, I/O die, or the like. The die package and the semiconductor device may include conductive features of different sizes that are used to electrically connect to a single redistribution structure. By forming die packages of bonded dies and by incorporating die packages and semiconductor devices in the same package, the size of the package may be reduced and the high-speed operation of the package may be improved.

FIG. 1 illustrates a cross-sectional view of an integrated circuit die 50 in accordance with some embodiments. The integrated circuit die 50 will be packaged in subsequent processing to form a die package 100 (see FIG. 6). The integrated circuit die 50 may be a logic die (e.g., central processing unit (CPU), graphics processing unit (GPU), system-on-a-chip (SoC), application processor (AP), microcontroller, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the integrated circuit die 50 includes a memory die or memory module, such as a dynamic random access memory (DRAM) die, a static random access memory (SRAM) die, magnetic random access memory die (MRAM), or the like. In some embodiments, the integrated circuit die 50 is a stacked device that includes a stack of memory dies. For example, the integrated circuit die 50 may be a stacked memory device such as a Wide I/O memory module, a hybrid memory cube (HMC) module, a high bandwidth memory (HBM) module, a low-power (LP) double data rate (DDR) memory module, such as LPDDR1, LPDDR2, LPDDR3, LPDDR4, or the like that includes multiple memory dies.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 42, such as silicon, doped or undoped, or an active layer of a semiconductor-on-insulator (SOI) substrate. The semiconductor substrate 42 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 42 has an active surface (e.g., the surface facing upwards in FIG. 1), sometimes called a front side, and an inactive surface (e.g., the surface facing downwards in FIG. 1), sometimes called a back-side.

In some embodiments, devices (not shown in FIG. 1) may be formed at the front surface of the semiconductor substrate 52, which may include active devices (e.g., transistors, diodes, etc.), capacitors, resistors, etc. In some embodiments, an inter-layer dielectric (ILD) (not shown) is formed over the front surface of the semiconductor substrate 52. The ILD 56 surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like. Conductive plugs (not shown) may extend through the ILD to electrically and physically couple the devices (e.g., to an interconnect structure 40, described below). For example, when the devices are transistors, the conductive plugs may couple the gates and source/drain regions of the transistors. The conductive plugs may be formed of tungsten, cobalt, nickel, copper, silver, gold, aluminum, the like, or combinations thereof.

In some embodiments, the integrated circuit die 50 includes an interconnect structure 40 that connects devices, modules, or dies to form an integrated circuit. FIG. 1 shows a single interconnect structure 40, but an integrated circuit die 50 may include more than one interconnect structure 40. The interconnect structure 40 may be formed by, for example, metallization patterns formed in dielectric layers. The metallization patterns may include metal lines and vias formed in one or more low-k dielectric layers.

The integrated circuit die 50 further includes conductive connectors 46 to which external connections are made. The conductive connectors 46 may be electrically coupled to the interconnect structure 40. The conductive connectors 46 may include, for example, conductive pads (e.g., aluminum pads, copper pads, or the like), conductive pillars (e.g., copper pillars, through vias, or the like), vias, other types of conductive features, the like, or combinations thereof. In some embodiments, one or more passivation layers (not shown) are formed over the integrated circuit die 50 and the conductive connectors 46 extend through the passivation layers. In some embodiments, the conductive connectors 46 may have a width that is between about 2 μm and about 30 μm, and may have a pitch that is between about 4 um and about 60 μm. In some embodiments, the conductive connectors 46 may have a pitch that is greater than that of the TSVs 112 and/or the TDVs 130.

As an example to form the conductive connectors 46, a seed layer (not shown) is formed over the back-side interconnect structure 40. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive connectors 46.

Optionally, solder regions (e.g., solder balls or solder bumps) may be disposed on the conductive connectors 46. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 48 may (or may not) be on the active side of the integrated circuit die 50, such as on the conductive connectors 46. The dielectric layer 48 laterally encapsulates the conductive connectors 46, and the dielectric layer 48 is laterally coterminous with the integrated circuit die 50. Initially, the dielectric layer 48 may bury the conductive connectors 46, such that the topmost surface of the dielectric layer 48 is above the topmost surfaces of the conductive connectors 46. In some embodiments in which solder regions are disposed on the conductive connectors 46, the dielectric layer 48 may bury the solder regions as well. Alternatively, the solder regions may be removed prior to forming the dielectric layer 48.

The dielectric layer 48 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 48 may be formed, for example, by spin coating, lamination, chemical vapor deposition (CVD), or the like. In some embodiments, the conductive connectors 46 are exposed through the dielectric layer 48 during formation of the integrated circuit die 50. In some embodiments, the conductive connectors 46 remain buried and are exposed during a subsequent process for packaging the integrated circuit die 50. Exposing the conductive connectors 46 may remove any solder regions that may be present on the conductive connectors 46.

In some embodiments, the integrated circuit die 50 is a stacked device that includes multiple semiconductor substrates 52. For example, the integrated circuit die may be a memory device such as a Wide I/O memory module, an HMC module, an HBM module, another type of memory device, or the like. In such embodiments, the integrated circuit die 50 includes multiple semiconductor substrates 52 interconnected by through-substrate vias (TSVs). Each of the semiconductor substrates 52 may (or may not) have an interconnect structure 40. In some embodiments, the conductive connectors 46 used to make external connection to the integrated circuit die 50 are TSVs formed in the topmost semiconductor substrate 52 of a stacked device.

FIGS. 2 through 6 illustrate cross-sectional views of the formation of a die package 100 (see FIG. 6), in accordance with some embodiments. In some embodiments, the die package 100 is, for example, a system-on-a-chip (SoC) package, a system-on-an-integrated-circuit (SoIC) package, or the like. With respect now to FIG. 1, there is illustrated a semiconductor device 102. The semiconductor device 102 may be a semiconductor device such as a memory device, a logic device, a power device, combinations of these, or the like, that is designed to work in conjunction with other devices within the die package wo. However, any suitable functionality may be utilized.

In an embodiment, the semiconductor device 102 includes a first substrate 104, first active devices (not separately illustrated), first metallization layers 106, a bond layer 108, and bond metal 110 within the bond layer 108. The first substrate 104 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as transistors, capacitors, resistors, inductors and the like that may be used to generate the desired structural and functional requirements of the design for the semiconductor device 102. The first active devices may be formed using any suitable methods either within or else on the first substrate 104.

The first metallization layers 106 are formed over the first substrate 104 and the first active devices and are designed to connect the various active devices to form functional circuitry. In an embodiment, the first metallization layers 106 are formed of alternating layers of dielectric and conductive materials and may be formed through any suitable process (such as deposition, damascene, dual damascene, etc.). In an embodiment, there may be four layers of metallization separated from the first substrate 104 by at least one interlayer dielectric layer (ILD), but the precise number of first metallization layers 106 is dependent upon the design.

The bond layer 108 is deposited over the first metallization layers 106. The bond layer 108 may be used for fusion bonding (also referred to as oxide-to-oxide bonding or dielectric-to-dielectric bonding). In accordance with some embodiments, the bond layer 108 is formed of a silicon-containing dielectric material such as silicon oxide, silicon nitride, or the like. The bond layer 108 may be deposited using any suitable method, such as CVD, high-density plasma chemical vapor deposition (HDPCVD), PVD, atomic layer deposition (ALD), or the like. The bond layer 108 may be planarized, for example, using a chemical mechanical polish (CMP) process.

The bond metal 110 may be formed within the bond layer 108. In an embodiment, the bond metal 110 may be formed by first forming openings within the bond layer 108 by first applying a photoresist which is applied over the top surface of the bond layer 108 and patterned. The patterned photoresist is then used as an etching mask to etch the bond layer 108 in order to form openings. The bond layer 108 may be etched by a suitable process such as dry etching (e.g., reactive ion etching (RIE) or neutral beam etching (NBE), etc.), wet etching, or the like. The bond metal 110 may also be referred to as "bond pads" or "metal pads."

Once the openings have been formed, the openings within the bond layer 108 are filled with the bond metal 110. In an embodiment the bond metal 110 may comprise a seed layer and a plate metal. The seed layer may be blanket deposited over top surfaces of the bond layer 108, and may comprise, for example, a copper layer. The seed layer may be deposited using processes such as sputtering, evaporation, or plasma-enhanced chemical vapor deposition (PECVD), or the like, depending upon the desired materials. The plate metal may be deposited over the seed layer through a plating process such as electrical or electro-less plating. The plate metal may comprise copper, a copper alloy, or the like. The plate metal may be a fill material, in some embodiments. A barrier layer (not separately illustrated) may be blanket deposited over top surfaces of the bond layer 108 before the seed layer. The barrier layer may comprise titanium, titanium nitride, tantalum, tantalum nitride, or the like.

Still referring to FIG. 2, the semiconductor device 102 may include through substrate vias (TSVs) 112 that extend through the substrate 104 to facilitate transmission of electrical signals. In other embodiments, the semiconductor device 102 does not include TSVs 112. In an embodiment, the TSVs 112 may be formed by initially forming through substrate via (TSV) openings into the substrate 104. The TSV openings may be formed by applying and patterning a photoresist (not shown) to expose regions of the substrate 104, and then etching the exposed portions of the substrate 104 to the desired depth. The TSV openings may be formed so as to extend into the substrate 104 at least further than the active devices formed within and/or on the substrate 104, and may extend to a depth greater than the eventual desired height of the substrate 104. Accordingly, while the depth is dependent upon the overall designs, the depth may be between about 20 μm and about 200 μm from the active devices on the substrate 104, such as a depth of about 50 μm from the active devices on the substrate 104.

Once the TSV openings have been formed within the substrate 104, the TSV openings may be lined with a liner (not illustrated). The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Additionally, the liner may be formed to a thickness of between about 0.1 μm and about 5 μm, such as about 1 μm.

Once the liner has been formed along the sidewalls and bottom of the TSV openings, a barrier layer (also not independently illustrated) may be formed and the remainder of the TSV openings may be filled with first conductive material, forming the TSVs 112. The first conductive material may comprise copper, although other suitable materials such as aluminum, alloys, doped polysilicon, combinations thereof, and the like, may alternatively be utilized. The first conductive material may be formed by electroplating copper onto a seed layer (not shown), filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

In some embodiments, the TSVs 112 may be formed to have a width between about 0.5 µm and 10 µm, such as about 2 µm. In some embodiments, the TSVs 112 may be formed to have a pitch between about 1 um and 40 µm, such as about 10 µm. However, any suitable dimensions may be utilized.

In some embodiments, multiple semiconductor devices 102 are formed on the same substrate 104, and then singulated to form individual semiconductor devices 102. The semiconductor devices 102 may be singulated using a sawing process, a laser process, an etching process, the like, or a combination thereof. After singulation, the semiconductor device 102 may have a thickness between about 30 um and about 200 µm, such as about 100 µm, in some embodiments. In some embodiments, the semiconductor device 102 may have an area between about 1 mm$^2$ and about 850 mm$^2$, such as about 30 mm$^2$. The semiconductor device 102 may have other dimensions than these. In some embodiments, known good dies (KGD) can be separated from defective dies prior to or after singulation.

FIG. 3 illustrates a bonding of semiconductor devices 102 to a first wafer 120. In some embodiments, the first wafer 120 may be an application processor wafer in which semiconductor die (not separately illustrated) are formed to work in conjunction with the semiconductor device 102. However, any suitable functionality, such as additional memory or other functionality, may also be utilized. The first wafer 120 may comprise a second substrate 122 and second active devices (not separately illustrated in FIG. 3). In an embodiment, the second substrate 122 and the second active devices may be similar to the first substrate 104 and the first active devices described above with respect to FIG. 2. For example, the second substrate 122 may be a semiconductor substrate and the second active devices may be active and passives devices formed on or in the second substrate 122. However, any suitable substrate and active devices may be utilized.

The first wafer 120 may also comprise a second metallization layer 124, second bond layer 126, and second bond metal 128. In one embodiment, the second metallization layer 124, the second bond layer 126, and the second bond metal 128 may be similar to the first metallization layer 106, the first bond layer 108 and the first bond metal 110. For example, the second bond metal 128 may be a metal placed into the second bond layer 126 after the second bond layer 126 has been formed.

In another embodiment, the second bond metal 128 and the second bond layer 126 are formed as part of the second metallization layer 124. For example, the second bond layer 126 may be formed as an initial dielectric layer overlying the active devices, while the second bond metal 128 may be formed within the second bond layer 126 and adjacent to the active devices, in what is known as a "via0" configuration. However, any suitable arrangement for the second bond metal 128 and the second bond layer 126 may be utilized.

After the second bond layer 126 and the second bond metal 128 have been formed, the semiconductor devices 102 may be bonded to the first wafer 120. In some embodiments, the semiconductor devices 102 may be bonded to the first wafer 120 using, e.g., a hybrid bonding process, in which the first bond layer 108 is bonded to the second bond layer 126 and the first bond metal 110 is bonded to the second bond metal 128. In some embodiments, the top surfaces of the first wafer 120 and the semiconductor devices 102 may first be activated utilizing, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized.

After the activation process, the first wafer 120 and the semiconductor devices 102 may be cleaned using, e.g., a chemical rinse, and then the semiconductor devices 102 are aligned and placed into physical contact with the first wafer 120. The semiconductor devices 102 may be placed on the first wafer 120 using a pick-and-place process, for example. The first wafer 120 and the semiconductor devices 102 are then subjected to thermal treatment and contact pressure to hybrid bond the first wafer 120 to the semiconductor devices 102. For example, the first wafer 120 and the semiconductor devices 102 may be subjected to a pressure of about 200 kPa or less, and a temperature between about 200° C. and about 400° C. to fuse the first bond layer 108 and the second bond layer 126. The first wafer 120 and the semiconductor devices 102 may then be subjected to a temperature at or above the eutectic point for material of the first bond metal 110 and the second bond metal 128, e.g., between about 150° C. and about 650° C., to fuse the metal bond pads. In this manner, fusion of the first wafer 120 and the semiconductor devices 102 forms a hybrid bonded device. In some embodiments, the bonded dies are baked, annealed, pressed, or otherwise treated to strengthen or finalize the bond.

Additionally, while the above description described the second bonding metal 128 as being within the second metallization layer 124 and the first bonding metal 110 being over the first metallization layer 106, this is intended to be illustrative and is not intended to be limiting. Rather, any suitable combination, including the first bonding metal no being located within the first metallization layer 106 (e.g., within the via0 layer). In other embodiments, the first wafer 120 may be bonded to the semiconductor devices 102 by direct surface bonding, metal-to-metal bonding, or another bonding process. A direct surface bonding process creates a dielectric-to-dielectric bond or a substrate-to-substrate bond through a cleaning and/or surface activation process followed by applying pressure, heat and/or other bonding process steps to the joined surfaces. In some embodiments, the first wafer 120 and the semiconductor devices 102 are bonded by metal-to-metal bonding that is achieved by fusing conductive elements. Any suitable bonding process may be utilized.

Figure 4:
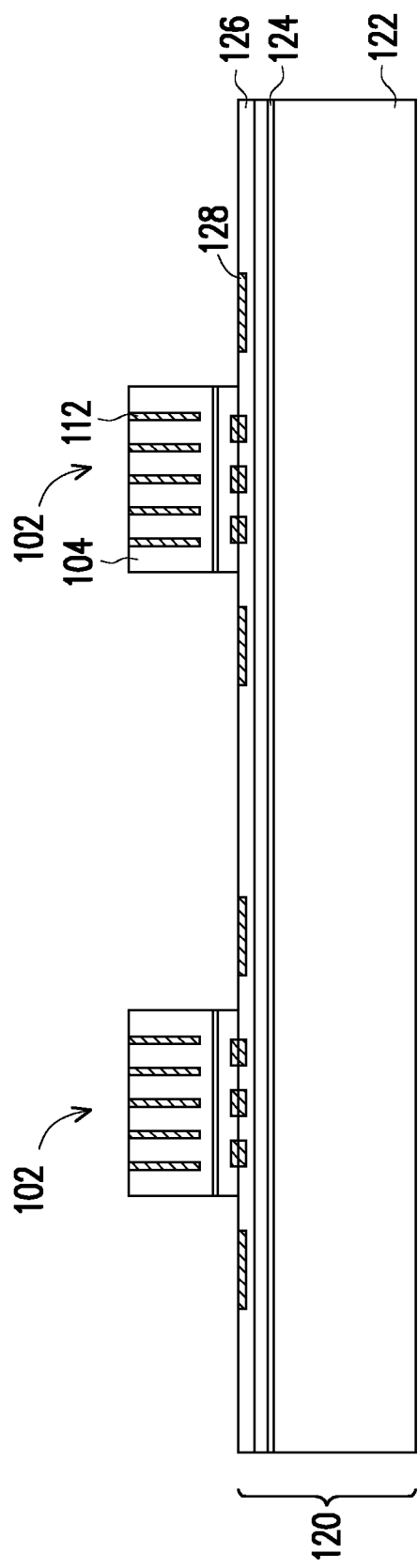

FIG. 4 illustrates a thinning of the semiconductor device 102 in order to expose the TSVs 112. In an embodiment, the thinning of the semiconductor devices 102 may be performed utilizing a planarization process such as a chemical mechanical planarization (CMP) process, in which etchants and abrasives are utilized along with a grinding platen in order to react and grind away material until a planar surface is formed and the TSVs 112 are exposed. However, any other suitable method of exposing the TSVs 112, such as a series of one or more etching processes, may also be utilized.

Figure 5:
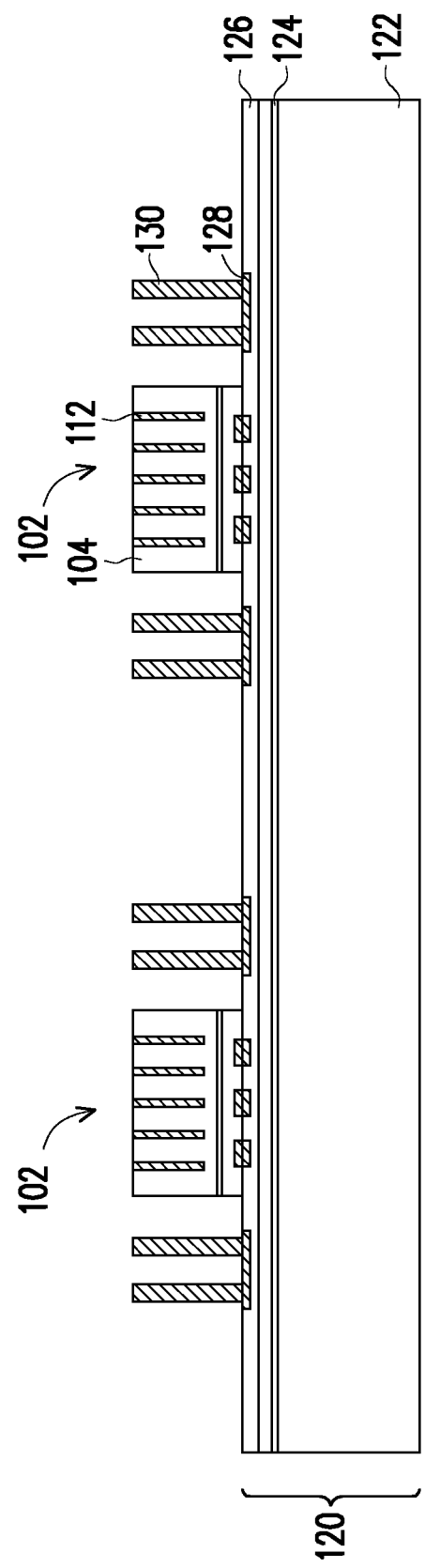

FIG. 5 illustrates a formation of through dielectric vias (TDVs) 130 onto the second bond metal 128. In other embodiments, TDVs 130 are not formed. In an embodiment the TDVs 130 may be formed by initially placing and patterning a photoresist (not separately illustrated in FIG. 5) over the second bond metal 128 (or over a separately placed seed layer if desired). In an embodiment, the pattern formed into the photoresist is a pattern for the TDVs 130. The TDVs 130 may be formed on different sides of the semiconductor devices 102. However, any suitable arrangement for the pattern of TDVs 130 may also be utilized. In some embodiments, the TDVs 130 may have a pitch greater than that of the TSVs 112.

Once the photoresist has been placed and patterned, the TDVs 130 may be formed within the photoresist. In an embodiment, the TDVs 130 comprise one or more conductive materials, such as copper, tungsten, other conductive metals, or the like, and may be formed, for example, by electroplating, electroless plating, or the like. After the conductive material of the TDVs 130 has been formed, the photoresist may be removed using a suitable removal process, such as a plasma ashing process or a wet chemical strip. In some embodiments, the TDVs 130 may be formed to have a width between about 10 μm and about 200 μm, such as about 150 μm. Additionally, the TDVs 130 may be formed having a height between about 35 μm and about 250 μm, such as about 180 μm. However, any suitable dimensions may be utilized.

After forming the TDVs 130, the first substrate 104 of each semiconductor devices 102 may be recessed, in some embodiments. The first substrates 104 may be recessed using, e.g., one or more etching processes, such as a wet etching process or a dry etching process. However, any suitable method of recessing the first substrates 104 such that the TSVs 112 extend away from the first substrates 104 may be utilized. In this manner, the TSVs 112 may protrude from the first substrate 104 of die package 100 to facilitate external connection in subsequent processing steps.

Figure 6:
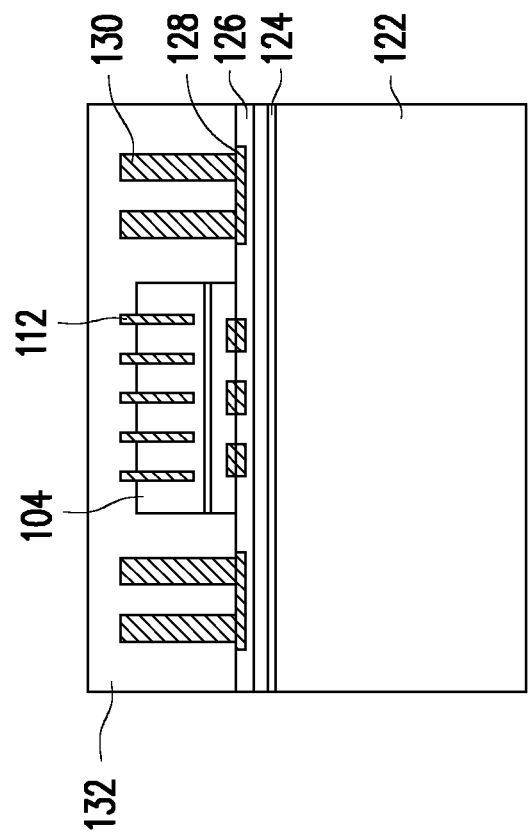

Turning to FIG. 6, a dielectric material 132 is formed and a singulation process is performed, forming individual die packages 100. An individual die package 100 is shown in FIG. 6. After recessing the first substrates 104, a dielectric material 132 may be formed over the semiconductor devices 102 and the TDVs 130. In some embodiments, the dielectric material 132 may be a material such as a low temperature polyimide material, although any other suitable dielectric, such as PBO, another polymer, a resin, an epoxy, the like, or combinations thereof may also be utilized. In some cases, the dielectric material 132 may be cured.

After forming the dielectric material 132, the first wafer 120 may be thinned and then a singulation process performed to singulate individual die package 100. In an embodiment, a back-side of the first wafer 120 may be thinned utilizing, for example, a planarization process such as a CMP process or a grinding process. However, any suitable process for thinning the first wafer 120, such as a series of one or more etches or a combination of polishing and etching, may also be utilized. The first wafer 120 may be singulated using a sawing process, a laser process, an etching process, the like, or a combination thereof.

FIGS. 7 through 20 illustrate cross-sectional views of intermediate steps during a process for forming a first package component 200, in accordance with some embodiments. A first package region 200A and a second package region 200B are illustrated, and one or more of the die package 100 are packaged to form an integrated circuit package in each of the package regions 200A and 200B. The integrated circuit packages may also be referred to as integrated fan-out (InFO) packages.

Figure 7:
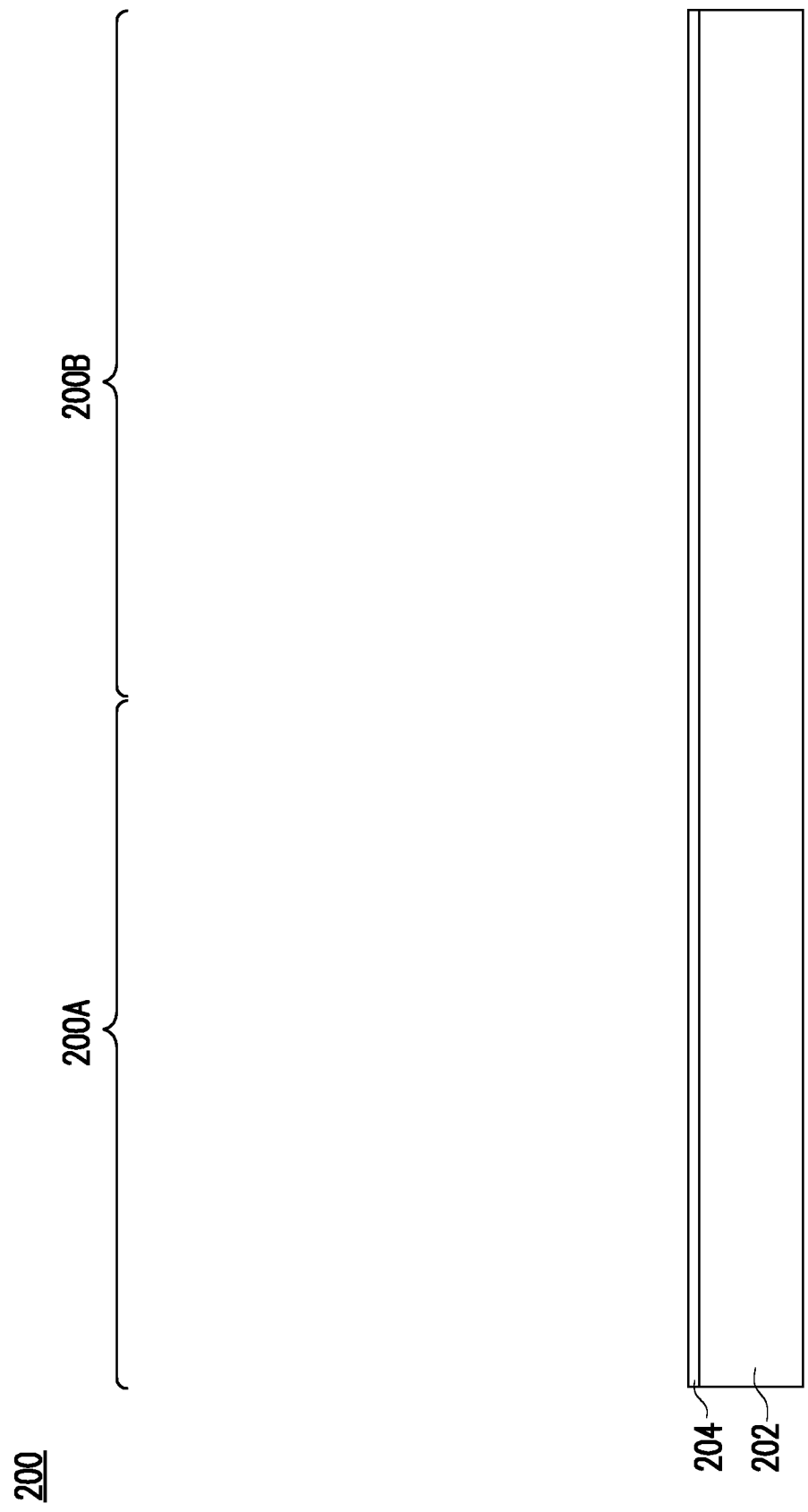
FIGS. 7 through 20 illustrate cross-sectional views of intermediate steps during a process for forming a package component, in accordance with some embodiments.

In FIG. 7, a carrier substrate 202 is provided, and a release layer 204 is formed on the carrier substrate 202. The carrier substrate 202 may be a glass carrier substrate, a ceramic carrier substrate, or the like. The carrier substrate 202 may be a wafer, panel, or the like, such that multiple packages can be formed on the carrier substrate 202 simultaneously.

The release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the carrier substrate 202, or may be the like. The top surface of the release layer 204 may be leveled and may have a high degree of planarity.

Figure 8:
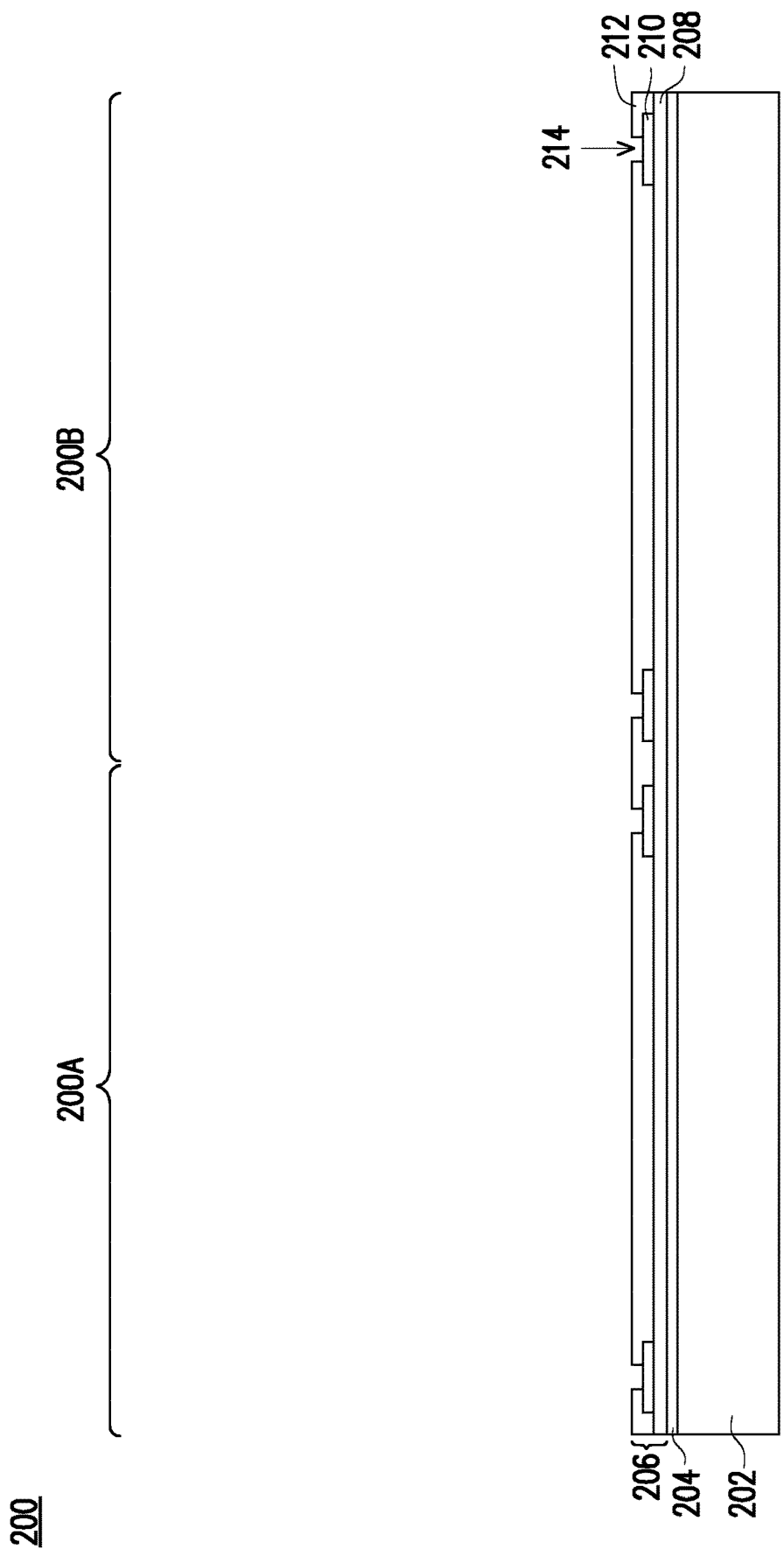

In FIG. 8, an optional back-side redistribution structure 206 may be formed on the release layer 204. In the embodiment shown, the back-side redistribution structure 206 includes a dielectric layer 208, a metallization pattern 210 (sometimes referred to as redistribution layers or redistribution lines), and a dielectric layer 212. The back-side redistribution structure 206 is optional, and in some embodiments, a dielectric layer without metallization patterns is formed on the release layer 204 in lieu of the back-side redistribution structure 206.

The dielectric layer 208 may be formed on the release layer 204. The bottom surface of the dielectric layer 208 may be in contact with the top surface of the release layer 104. In some embodiments, the dielectric layer 208 is formed of a polymer, such as polybenzoxazole (PBO), polyimide, benzocyclobutene (BCB), or the like. In other embodiments, the dielectric layer 208 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 208 may be formed by any acceptable deposition process, such as spin coating, CVD, laminating, the like, or a combination thereof.

The metallization pattern 210 may be formed on the dielectric layer 208. As an example to form metallization pattern 210, a seed layer is formed over the dielectric layer 208. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 210. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 210.

The dielectric layer 212 may be formed on the metallization pattern 210 and the dielectric layer 208. In some embodiments, the dielectric layer 212 is formed of a polymer, which may be a photo-sensitive material such as PBO, polyimide, BCB, or the like, that may be patterned using a lithography mask. In other embodiments, the dielectric layer 212 is formed of a nitride such as silicon nitride; an oxide such as silicon oxide, PSG, BSG, BPSG; or the like. The dielectric layer 212 may be formed by spin coating, lamination, CVD, the like, or a combination thereof. The dielectric layer 212 is then patterned to form openings 214 exposing portions of the metallization pattern 210. The patterning may be formed by an acceptable process, such as by exposing the dielectric layer 212 to light when the dielectric layer 212 is a photo-sensitive material or by etching using, for example, an anisotropic etch. If the dielectric layer 212 is a photo-sensitive material, the dielectric layer 212 can be developed after the exposure.

It should be appreciated that the back-side redistribution structure 206 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 9:
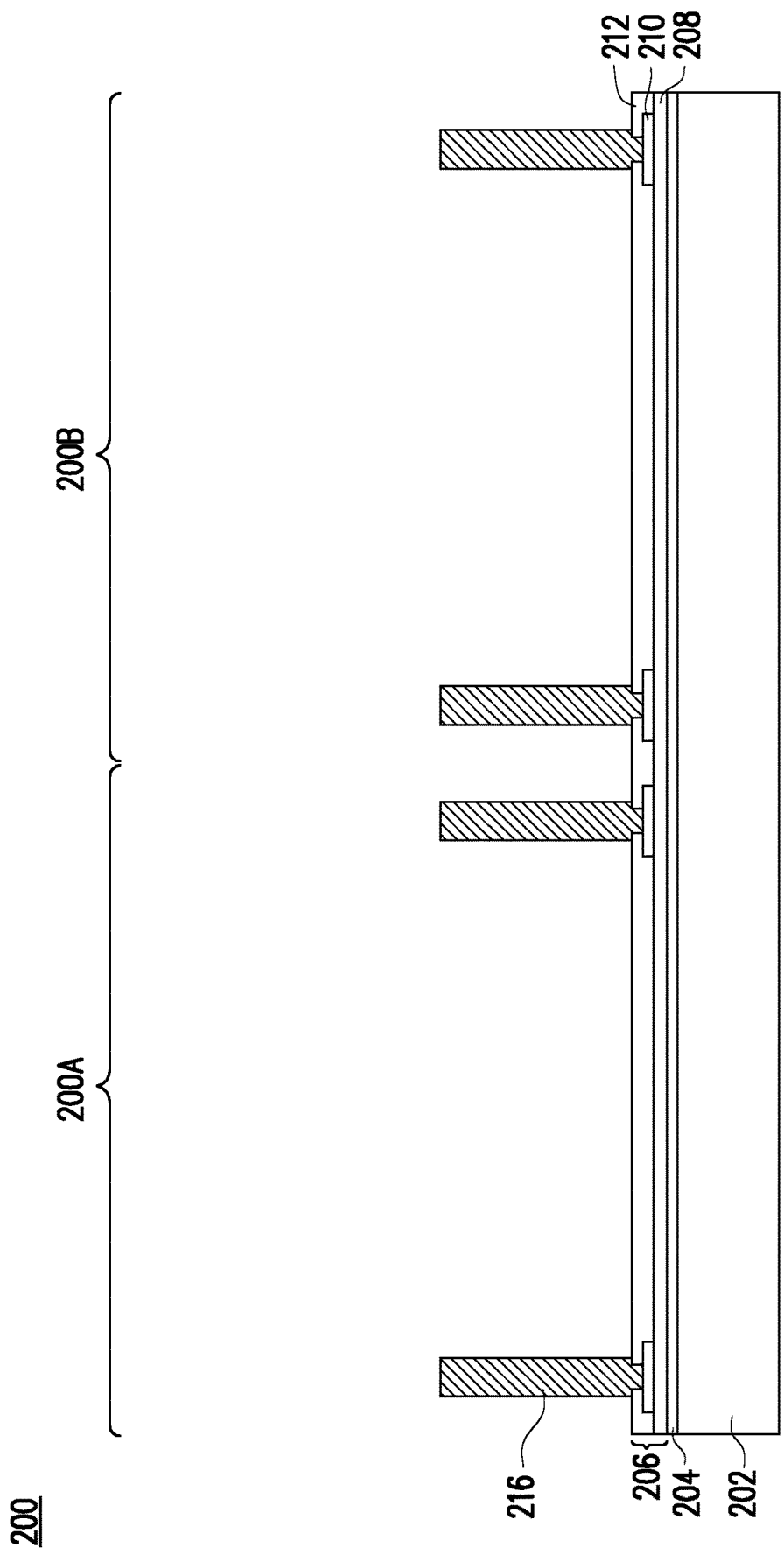

In FIG. 9, through vias 216 are formed in the openings 214 and extending away from the topmost dielectric layer of the back-side redistribution structure 206 (e.g., the dielectric layer 212). As an example to form the through vias 216, a seed layer (not shown) is formed over the back-side redistribution structure 206, e.g., on the dielectric layer 212 and portions of the metallization pattern 210 exposed by the openings 214. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 216.

Figure 10:
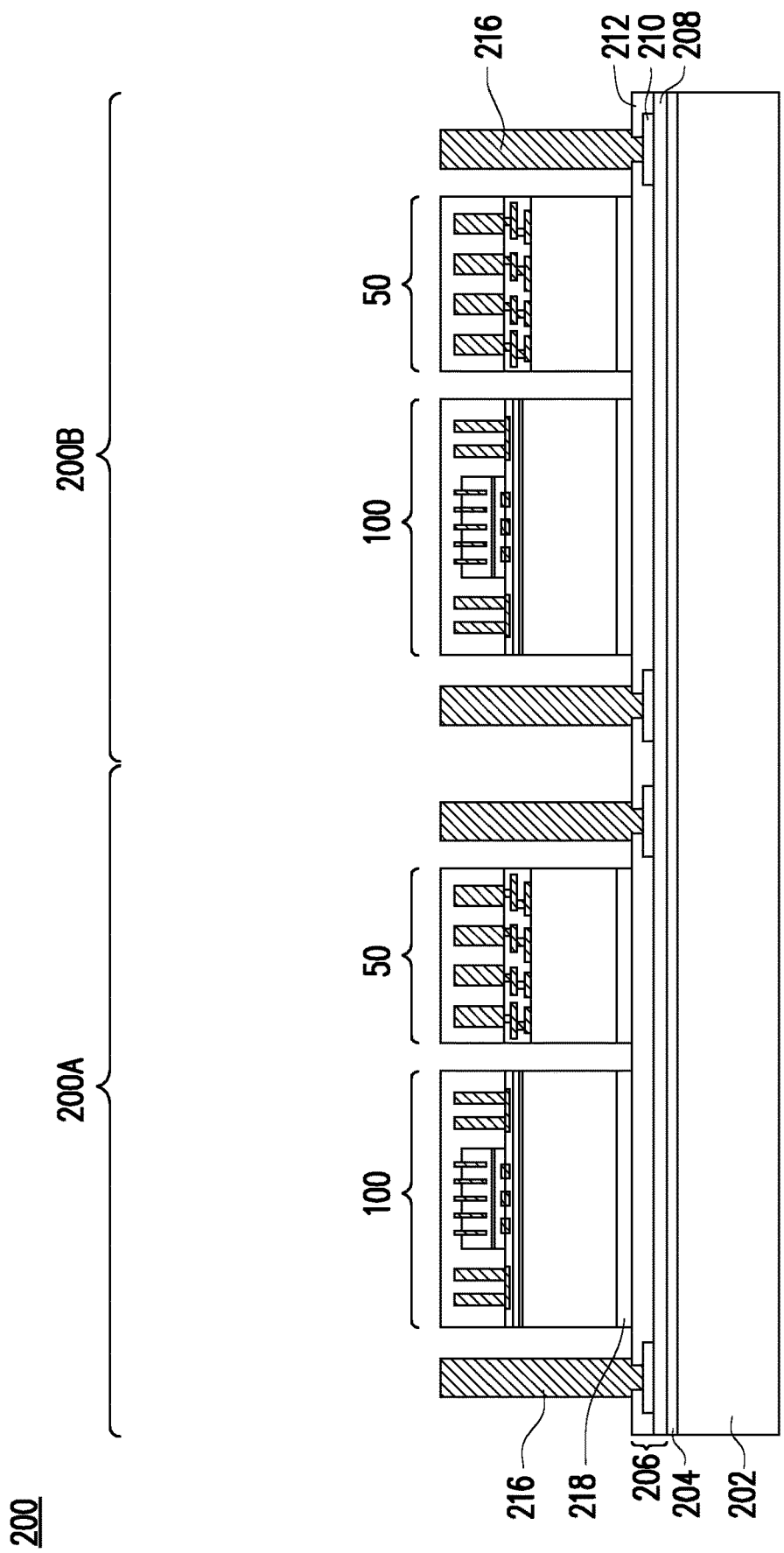

In FIG. 10, integrated circuit dies 50 and die packages 100 are adhered to the dielectric layer 212 by an adhesive 218. A desired type and quantity of integrated circuit dies 50 and die packages 100 are adhered in each of the package regions 200A and 200B. In the embodiment shown, an integrated circuit die 50 and a die package 100 are adhered within each package region 200A and 200B. The integrated circuit die 50 and the die package 100 may be adhered adjacently as shown, or may be separated by one or more through vias 216 in other embodiments. The integrated circuit die 50 and the die package 100 may be arranged differently than shown, and additional integrated circuit dies, die packages, or other devices may also be adhered within each package region.

In some embodiments, the integrated circuit die 50 may be a memory device as previously described, such as a dynamic random access memory (DRAM) die, static random access memory (SRAM) die, hybrid memory cube (HMC) module, a high bandwidth memory (HBM) module, a Wide I/O memory module, or the like. In some embodiments, the die package 100 may be a system-on-a-chip (SoC) as previously described, or the die package 100 may be a logic device, such as a central processing unit (CPU), graphics processing unit (GPU), microcontroller, or the like. The integrated circuit die 50 and the die package 100 may have different sizes (e.g., different heights and/or surface areas), or may have the same size (e.g., same heights and/or surface areas). The space available for the through vias 216 in the package regions 200A and 200B may be limited, particularly when the integrated circuit die 50 or the die package 100 includes a device with a large footprint, such as a SoC. Use of the back-side redistribution structure 206 allows for an improved interconnect arrangement when the package regions 200A and 200B have limited space available for the through vias 216.

The adhesive 218 is formed on back-sides of the integrated circuit dies 50 and the die packages 100 and adheres the integrated circuit dies 50 and the die packages 100 to the back-side redistribution structure 206, such as to the dielectric layer 212. The adhesive 218 may be any suitable adhesive, epoxy, die attach film (DAF), or the like. The adhesive 218 may be applied to back-sides of the integrated circuit dies 50 and the die packages 100 or may be applied over the surface of the carrier substrate 202. For example, the adhesive 118 may be applied to the back-sides of the integrated circuit dies 50 and the die package 100 before singulation.

Figure 11:
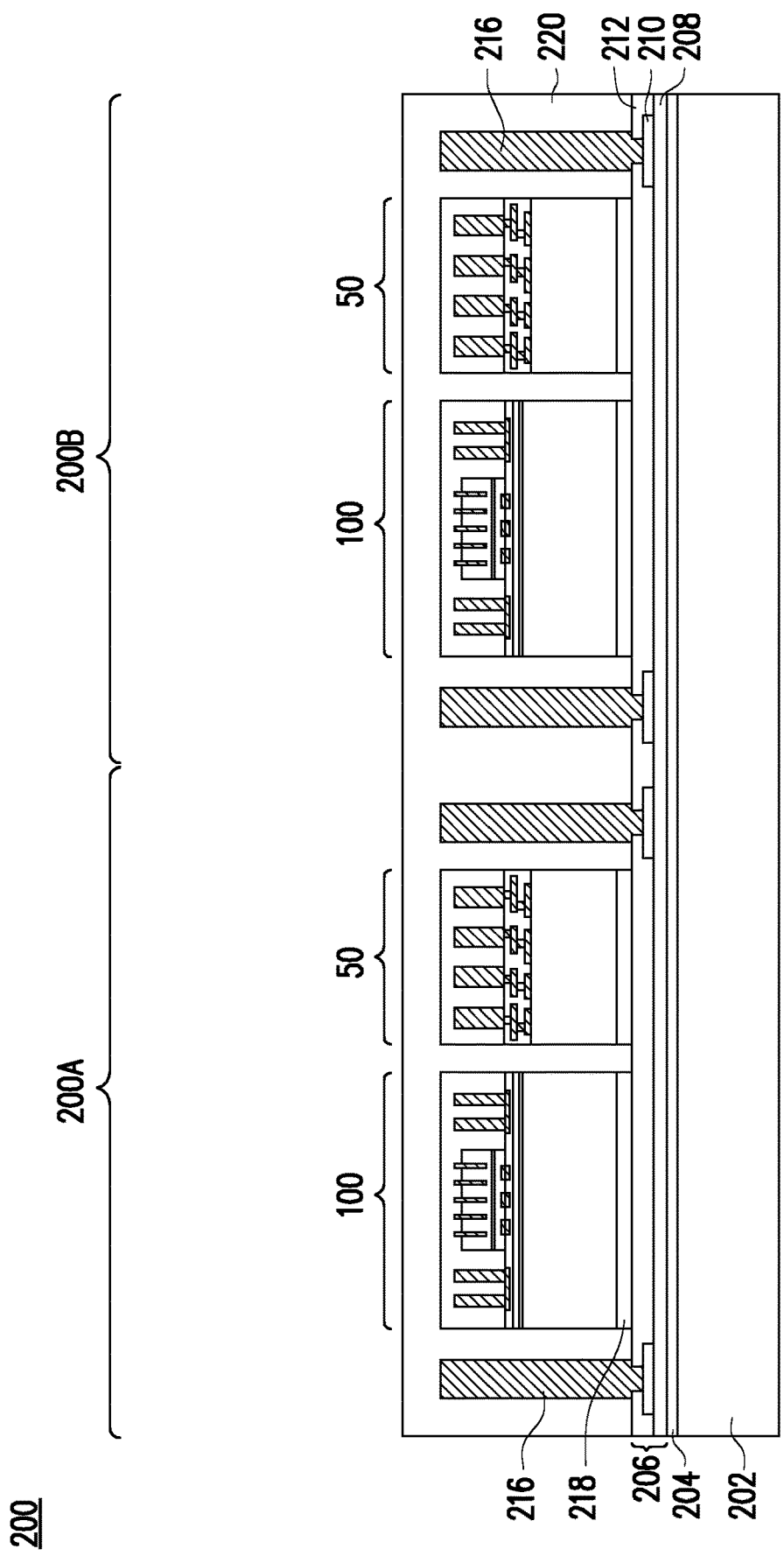

In FIG. 11, an encapsulant 220 is formed on and around the various components. After formation, the encapsulant 220 encapsulates the through vias 216, the integrated circuit dies 50, and the die packages 100. The encapsulant 220 may be a molding compound, epoxy, resin, or the like. The encapsulant 220 may be applied by compression molding, transfer molding, or the like, and may be formed over the carrier substrate 202 such that the through vias 216, the integrated circuit dies 50, and/or the die packages 100 are buried or covered. The encapsulant 220 is further formed in gap regions between integrated circuit dies 50 and die packages 100. The encapsulant 220 may be applied in liquid or semi-liquid form and then subsequently cured.

Figure 12:
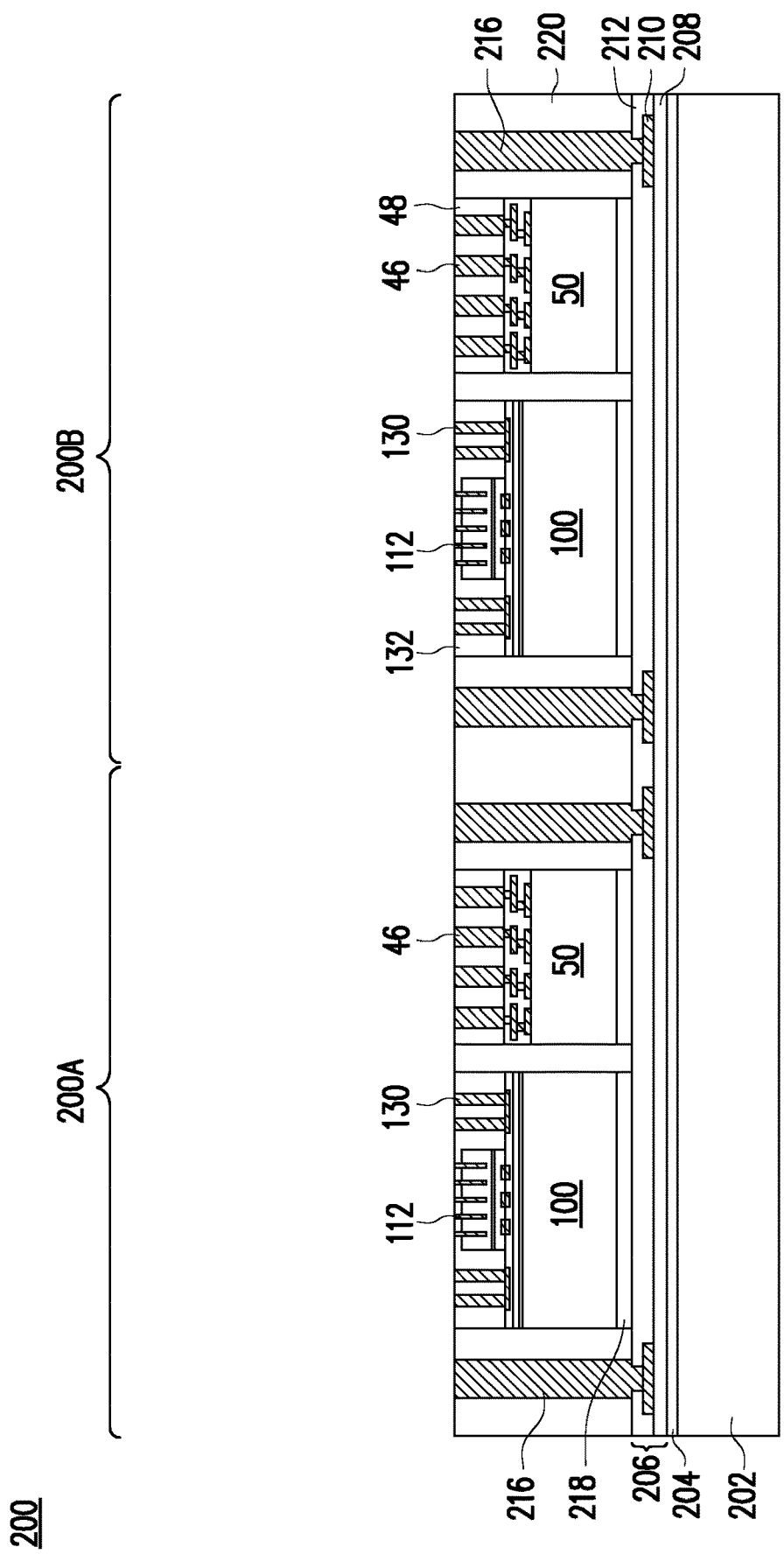

In FIG. 12, a planarization process is performed on the encapsulant 220 to expose the through vias 216, the conductive connectors 46 of the integrated circuit dies 50, and the TSVs 112 and the TDVs 130 of the die packages 100. The planarization process may also remove material of the through vias 216, the dielectric layers 48 and/or the conductive connectors 46 of the integrated circuit dies 50, or the dielectric material 132, the TSVs 112, and/or the TDVs 130 of the die packages 100. Top surfaces of the through vias 216, the conductive connectors 46, the dielectric layers 48, the dielectric material 132, the TSVs 112, the TDVs 130, and/or the encapsulant 220 may be coplanar after the planarization process. The planarization process may be, for example, a chemical-mechanical polish (CMP), a grinding process, or the like. In some embodiments, the planarization may be omitted, for example, if the through vias 216, the conductive connectors 46, the TSVs 112, and/or the TDVs 130 are already exposed.

In FIGS. 13 through 16, a front-side redistribution structure 222 (see FIG. 16) is formed over the encapsulant 220, through vias 216, the integrated circuit dies 50, and the die packages 100. The front-side redistribution structure 222 includes dielectric layers 224, 228, 232, and 236; and metallization patterns 226, 230, and 234. The metallization patterns may also be referred to as redistribution layers ("RDLs") or redistribution lines. The front-side redistribution structure 222 is shown as an example having three layers of metallization patterns. More or fewer dielectric layers and metallization patterns may be formed in the front-side redistribution structure 222. If fewer dielectric layers and metallization patterns are to be formed, steps and process discussed below may be omitted. If more dielectric layers and metallization patterns are to be formed, steps and processes discussed below may be repeated.

Figure 13:
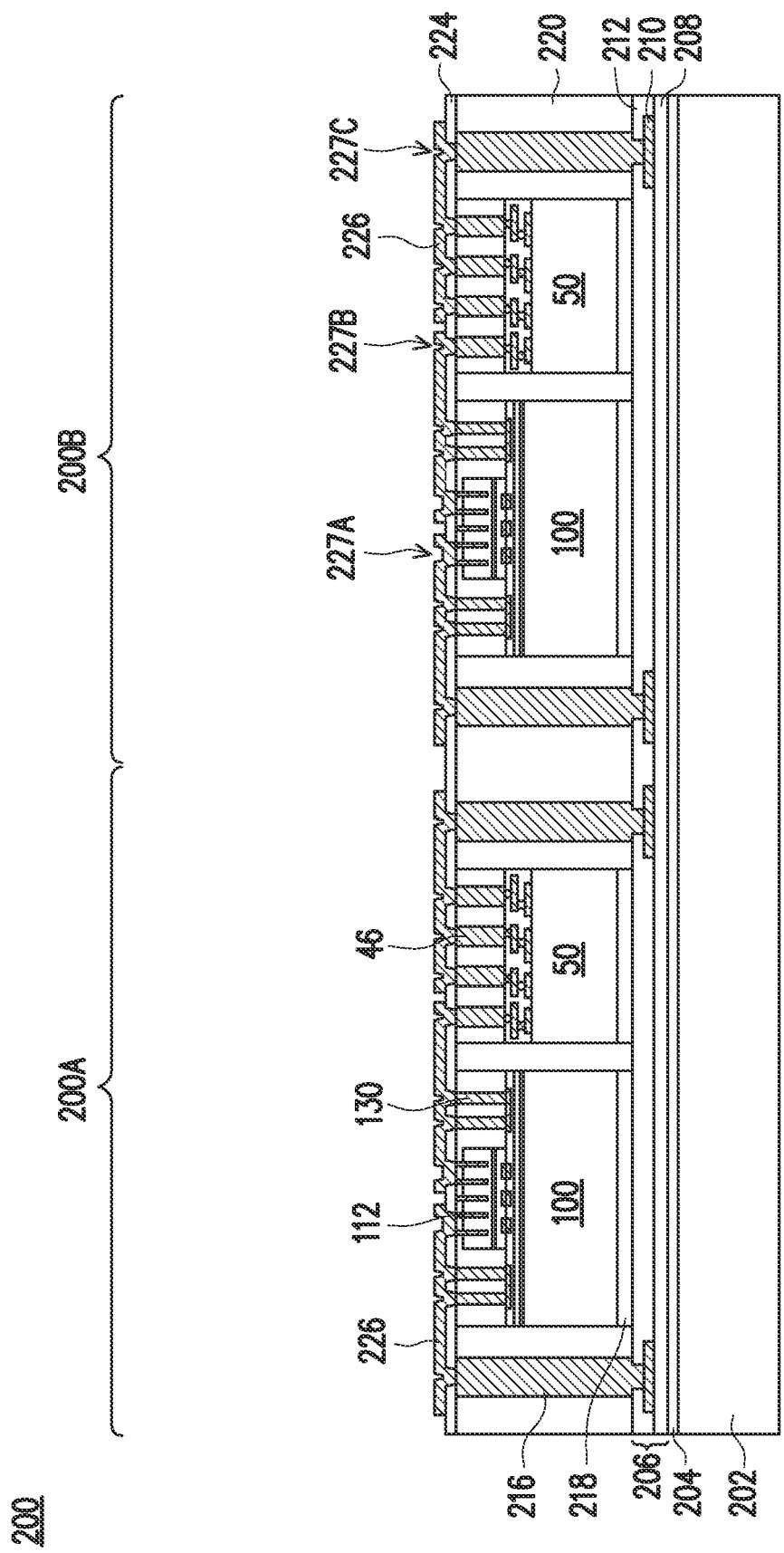

In FIG. 13, the dielectric layer 224 is deposited on the encapsulant 220, the through vias 216, the conductive connectors 46, the TSVs 112, and the TDVs 130. In some embodiments, the dielectric layer 224 is formed of a photosensitive material such as PBO, polyimide, BCB, or the like, which may be patterned using a lithography mask. The dielectric layer 224 may be formed by spin coating, lamination, CVD, the like, or a combination thereof. The dielectric layer 224 is then patterned. The patterning forms openings exposing portions of the through vias 216, the conductive connectors 46, the TSVs 112, and the TDVs 130. The patterning may be formed by an acceptable process, such as by exposing the dielectric layer 224 to light when the dielectric layer 224 is a photo-sensitive material or by etching using, for example, an anisotropic etch. If the dielectric layer 224 is a photo-sensitive material, the dielectric layer 224 can be developed after the exposure.

The metallization pattern 226 is then formed. The metallization pattern 226 includes line portions (also referred to as conductive lines) on and extending along the major surface of the dielectric layer 224. The metallization pattern 226 further includes via portions (also referred to as conductive vias) extending through the dielectric layer 224 to physically and electrically couple the through vias 216, the integrated circuit dies 50, and the die packages 100. As an example to form the metallization pattern 226, a seed layer is formed over the dielectric layer 224 and in the openings extending through the dielectric layer 224. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 226. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 226. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. In some embodiments, the via portions of the metallization pattern 226 may have a pitch between about 0.8 µm and about 20 µm.

The via portions of the metallization pattern 226 may be formed to make electrical connections to conductive features such as the through vias 216, the conductive connectors 46, the TSVs 112, and the TDVs 130, as shown in FIG. 13. As illustrative examples, a via portion 227A making electrical connection to a TSV 112, a via portion 227B making electrical connection to a conductive connector 46, and a via portion 227C making electrical connection to a through via 216 are indicated in FIG. 13. The via portions of the metallization pattern 226 may be patterned to make electrical connections to these conductive features even when the conductive features have different sizes or different pitches. For example, the conductive connectors 46 may have a greater width or a greater pitch than the TDVs 130 or the TSVs 112. In some cases, some conductive features may have a relatively small pitch compared with that of the via portions of the metallization pattern 226, or the conductive features may have a pitch smaller than that of the via portions of the metallization pattern 226. In cases such as this, a single via portion of the metallization pattern 226 may be formed to extend across two or more adjacent conductive features, in some embodiments. In this manner, a via portion may make electrical connection with multiple conductive features. For example, in FIG. 13 a single via portion of the metallization pattern 226 is shown extending across two TSVs 112, making electrical connection to those two TSVs 112. By forming the metallization pattern 226 in this manner, devices having different sizes, pitches, or types of conductive features may be connected by the metallization pattern 226. For example, the metallization pattern 226 may connect multiple devices formed using processes of different technology nodes and having different types of conductive features used to make electrical connection.

Figure 14:
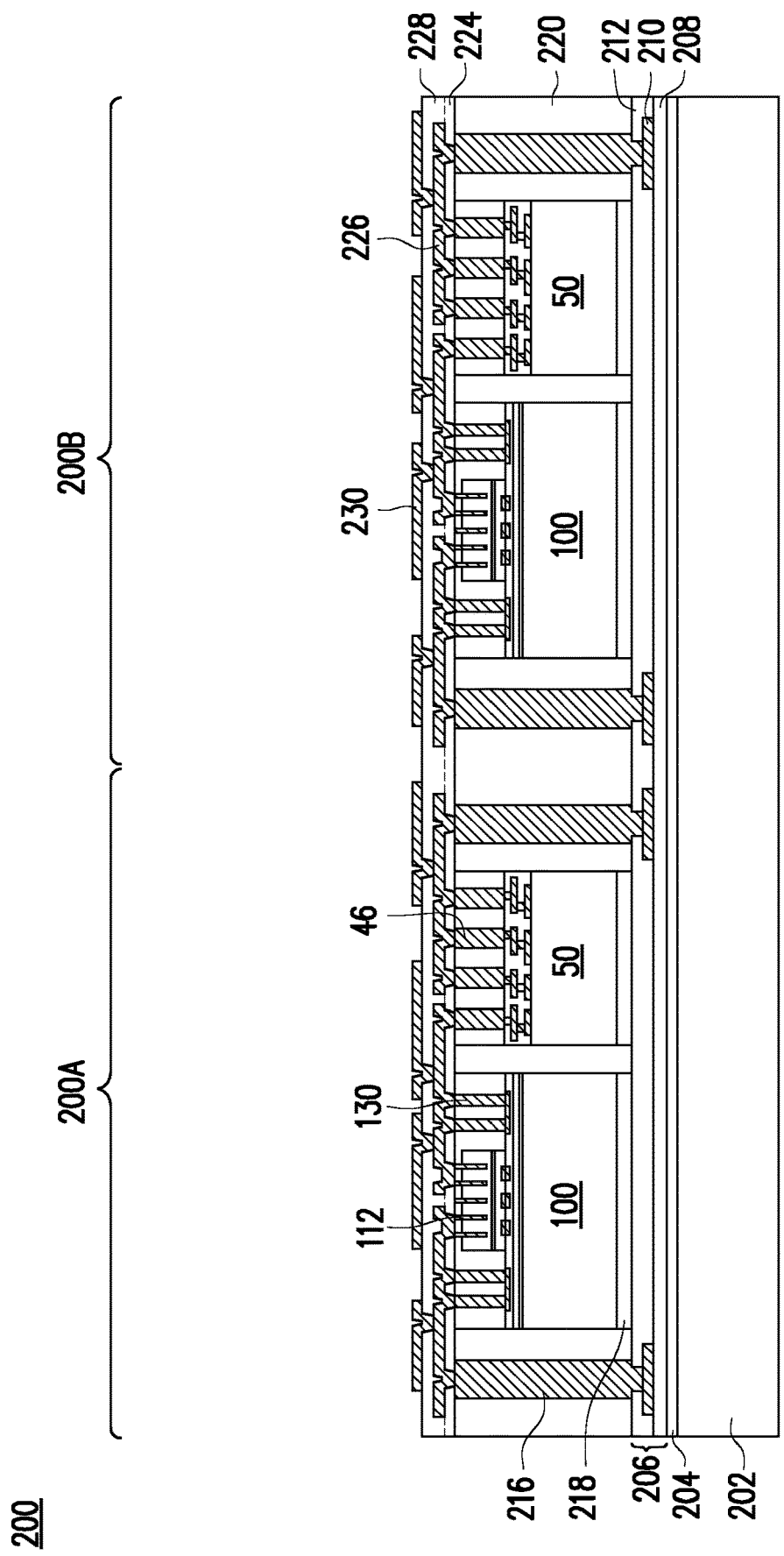

In FIG. 14, the dielectric layer 228 is deposited on the metallization pattern 226 and dielectric layer 224. The dielectric layer 228 may be formed in a manner similar to the dielectric layer 224, and may be formed of a similar material as the dielectric layer 224. The metallization pattern 230 is then formed. The metallization pattern 230 includes line portions on and extending along the major surface of the dielectric layer 228. The metallization pattern 230 further includes via portions extending through the dielectric layer 228 to physically and electrically couple the metallization pattern 226. The metallization pattern 230 may be formed in a similar manner and of a similar material as the metallization pattern 226. In some embodiments, the metallization pattern 230 has a different size than the metallization pattern 226. For example, the conductive lines and/or vias of the metallization pattern 230 may be wider or thicker than the conductive lines and/or vias of the metallization pattern 226. Further, the metallization pattern 230 may be formed to a greater pitch than the metallization pattern 226.

Figure 15:
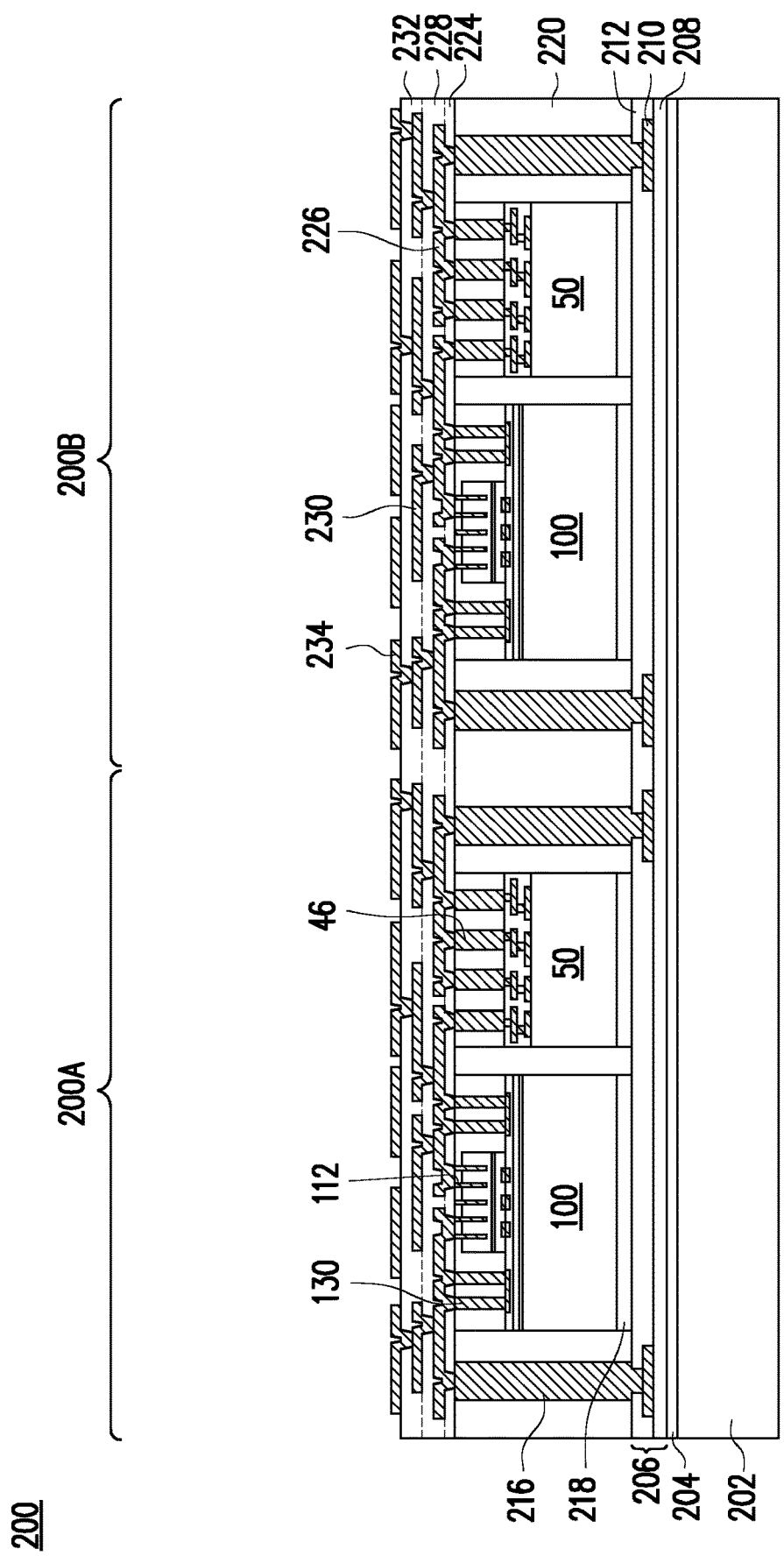

In FIG. 15, the dielectric layer 232 is deposited on the metallization pattern 230 and dielectric layer 228. The dielectric layer 232 may be formed in a manner similar to the dielectric layer 224, and may be formed of a similar material as the dielectric layer 224.

The metallization pattern 234 is then formed. The metallization pattern 234 includes line portions on and extending along the major surface of the dielectric layer 232. The metallization pattern 234 further includes via portions extending through the dielectric layer 232 to physically and electrically couple the metallization pattern 230. The metallization pattern 234 may be formed in a similar manner and of a similar material as the metallization pattern 226. The metallization pattern 234 is the topmost metallization pattern of the front-side redistribution structure 222. As such, all of the intermediate metallization patterns of the front-side redistribution structure 222 (e.g., the metallization patterns 226 and 230) are disposed between the metallization pattern 234 and the integrated circuit dies 50 and the die packages 100. In some embodiments, the metallization pattern 234 has a different size than the metallization patterns 226 and 230. For example, the conductive lines and/or vias of the metallization pattern 234 may be wider or thicker than the conductive lines and/or vias of the metallization patterns 226 and 230. Further, the metallization pattern 234 may be formed to a greater pitch than the metallization pattern 230.

Figure 16:
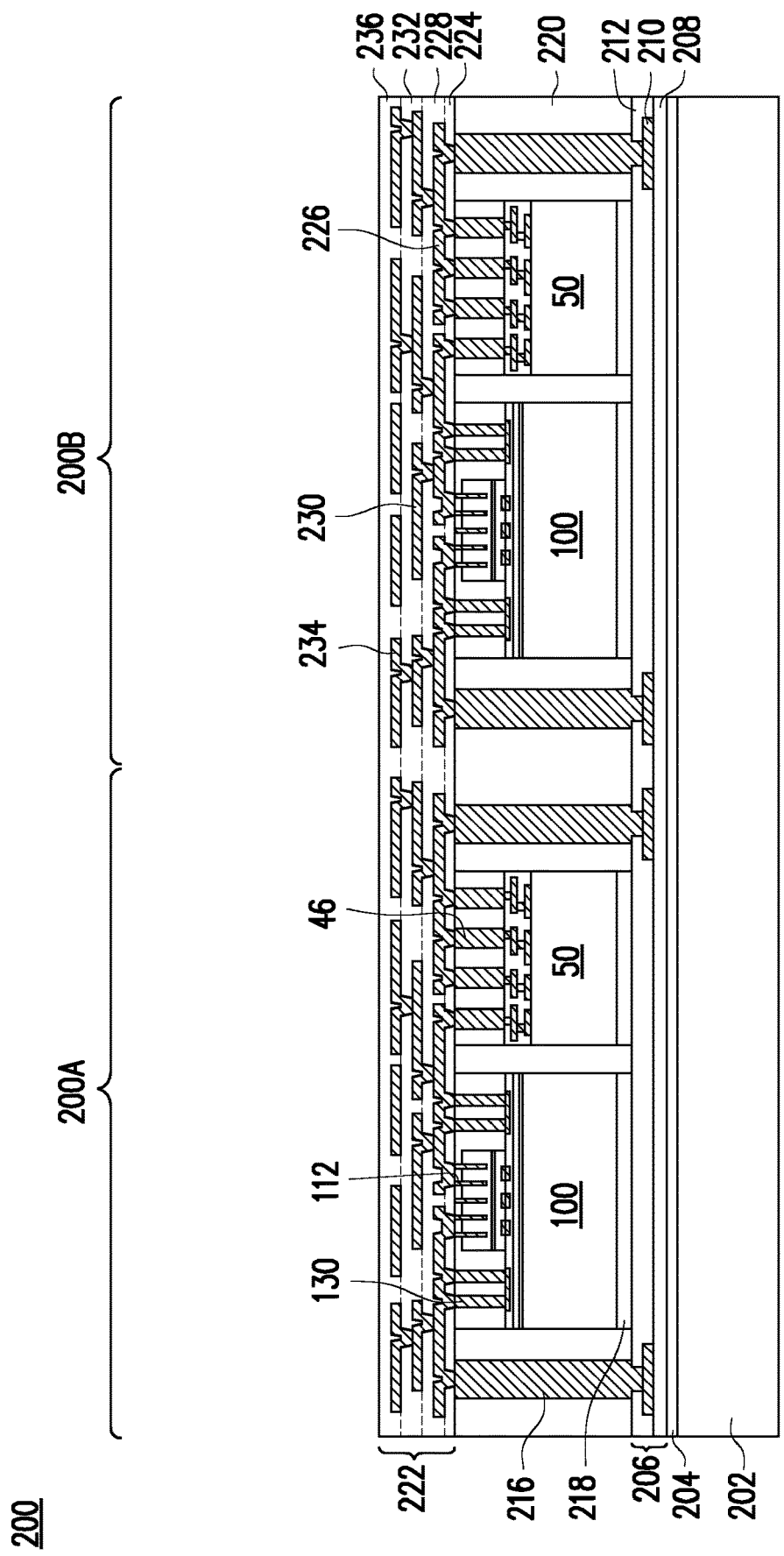

In FIG. 16, the dielectric layer 236 is deposited on the metallization pattern 234 and dielectric layer 232. The dielectric layer 236 may be formed in a manner similar to the dielectric layer 224, and may be formed of the same material as the dielectric layer 224. The dielectric layer 236 is the topmost dielectric layer of the front-side redistribution structure 222. As such, all of the metallization patterns of the front-side redistribution structure 222 (e.g., the metallization patterns 226, 230, and 234) are disposed between the dielectric layer 236 and the integrated circuit dies 50 and the die packages 100. Further, all of the intermediate dielectric layers of the front-side redistribution structure 222 (e.g., the dielectric layers 224, 228, 232) are disposed between the dielectric layer 236 and the integrated circuit dies 50 and the die packages 100.

Figure 17:
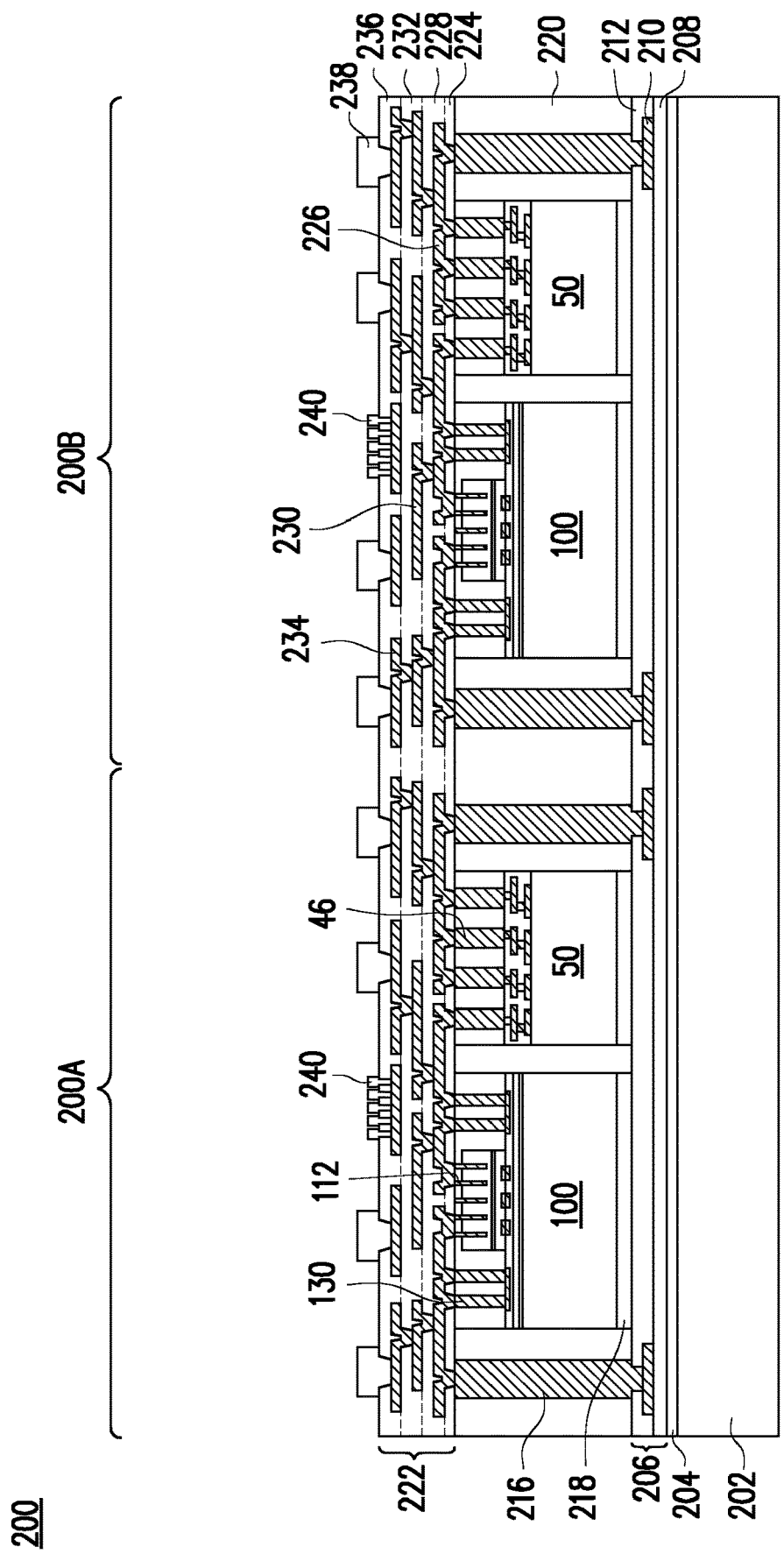

In FIG. 17, UBMs 238 are formed for external connection to the front-side redistribution structure 222. The UBMs 238 have bump portions on and extending along the major surface of the dielectric layer 236, and have via portions extending through the dielectric layer 236 to physically and electrically couple the metallization pattern 234. As a result, the UBMs 238 are electrically coupled to the through vias 216 and the integrated circuit dies 50 and the die packages 100. The UBMs 238 may be formed of the same material as the metallization pattern 226, or a different material or combination of materials. In some embodiments, the UBMs 238 have a different size than the metallization patterns 226, 230, or 234. In some embodiments, UBMs 240 are also formed for external connection of surface devices 242 (described below) connection to the front-side redistribution structure 222.

Figure 18:
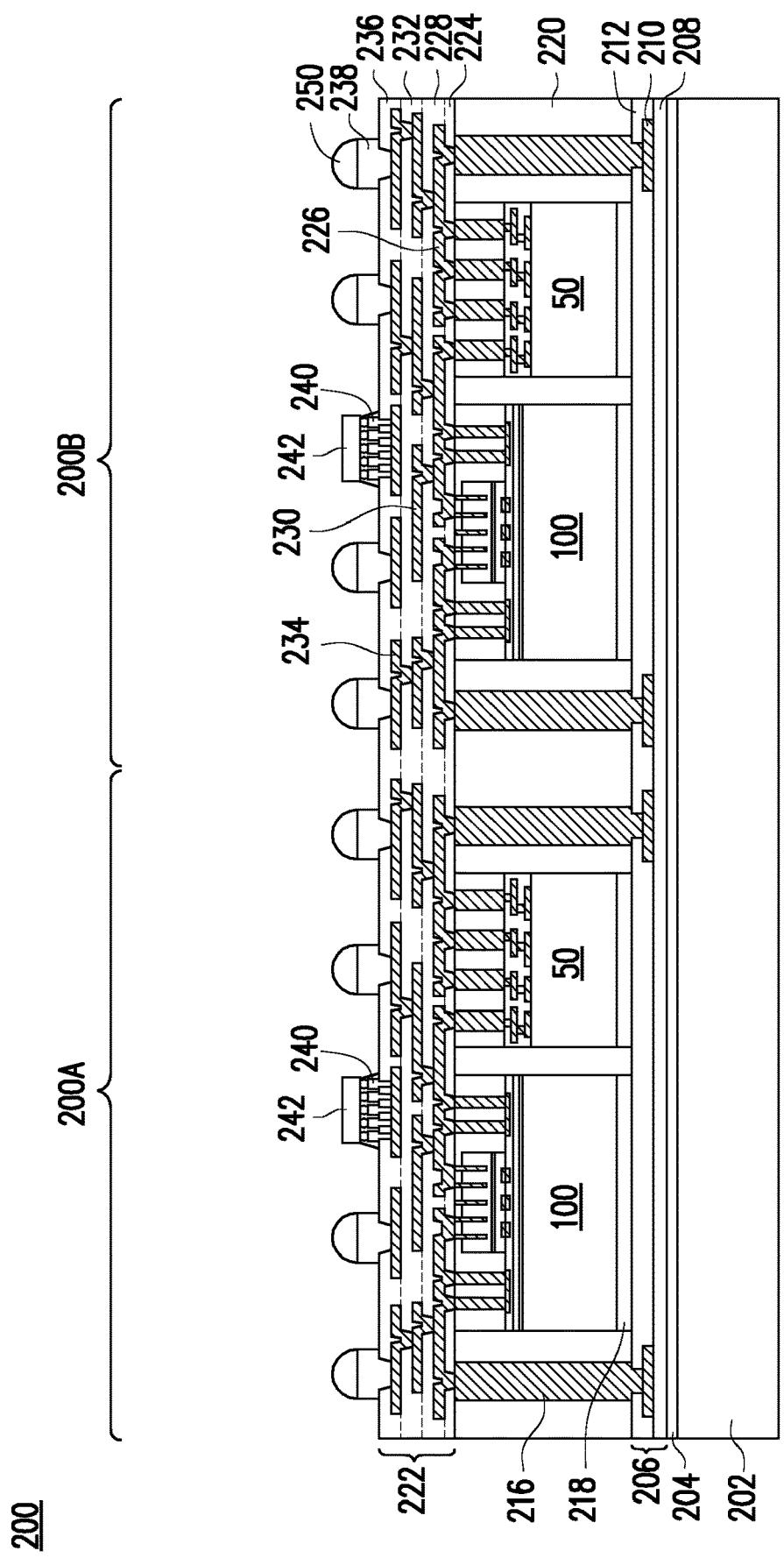

In FIG. 18, conductive connectors 250 are formed on the UBMs 238. The conductive connectors 250 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 250 may include a conductive material such as solder, copper, aluminum, gold, nickel, silver, palladium, tin, the like, or a combination thereof. In some embodiments, the conductive connectors 250 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 250 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Still referring to FIG. 18, one or more surface devices 242 are attached to the UBMs 240 to make electrical connection with the redistribution structure 222. The surface devices 242 may be, for example, a semiconductor device or other device that includes one or more passive devices such as capacitors, resistors, inductors, and the like. The surface devices 242 may be, for example, integrated passive devices (IPDs). The integrated surface devices 242 attached to the redistribution structure 222 may be similar devices or may be different types of devices. FIG. 18 illustrates the placement of two surface devices 242, but in other embodiments more or fewer surface devices 242 may be attached.

In other embodiments, the surface devices 242 may be attached before formation of the conductive connectors 250. The surface devices 242 may be attached by, for example, sequentially dipping connectors (e.g., conductive bumps or pads) of the surface devices 242 such as solder balls into flux, and then using a pick-and-place tool in order to physically align the connectors of the surface devices 242 with corresponding UBMs 240. In some cases, a reflow process may be performed to bond the connectors of the surface devices 242. In some cases, the reflow process may be performed on both the surface devices 242 and the conductive connectors 250.

In some embodiments, an underfill is formed between each surface device 242 and the redistribution structure 222, surrounding the connectors of the surface devices 242. The underfill may reduce stress and protect the joints from damage resulting from the reflow process. The underfill may be formed by a capillary flow process after the surface devices 242 are attached, or may be formed by a suitable deposition method before the surface devices 242 are attached. In some embodiments in which a flux is used to attach the surface devices 242, it may act as the underfill.

Figure 19:
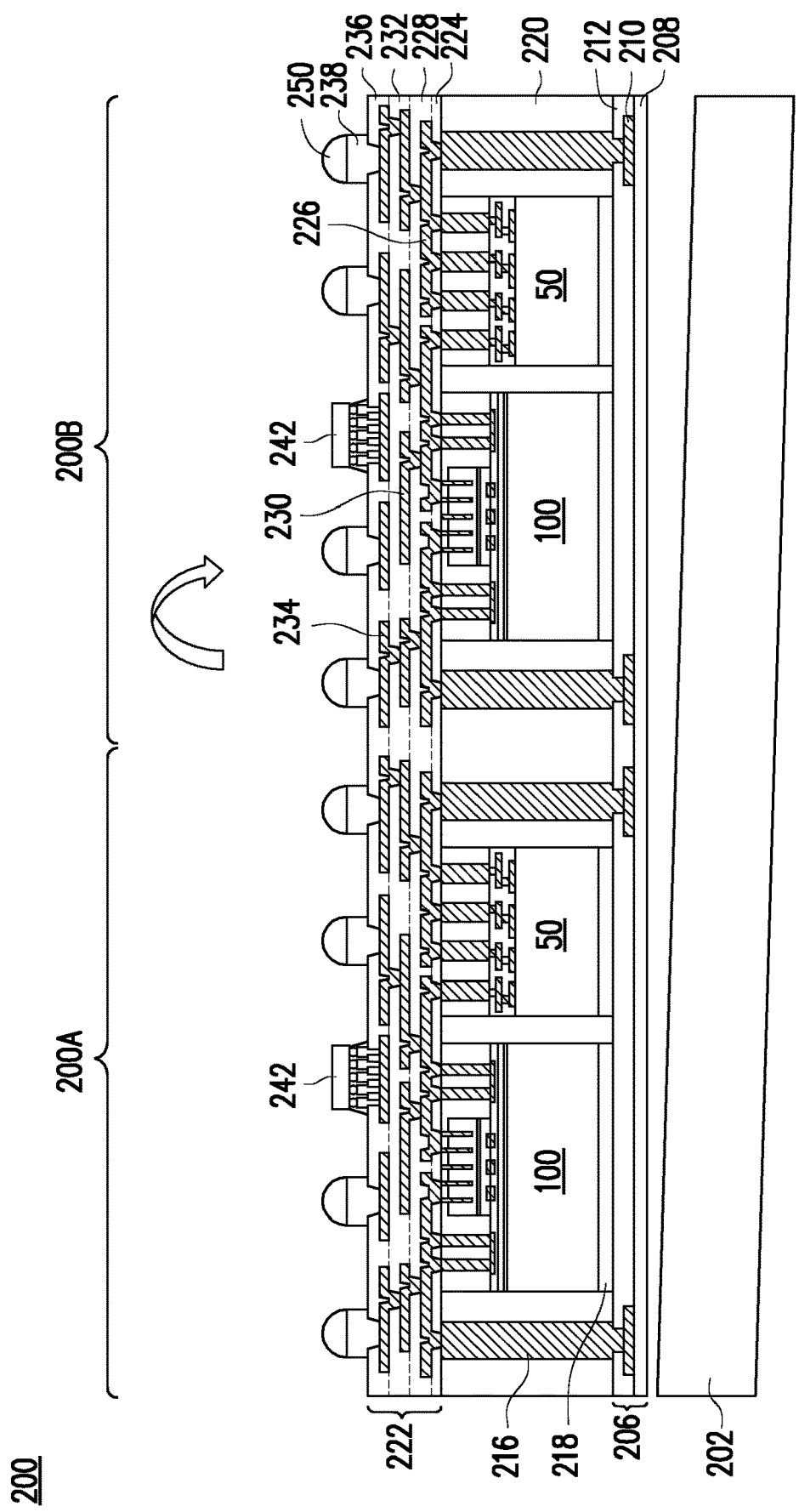

In FIG. 19, a carrier substrate de-bonding is performed to detach (or "de-bond") the carrier substrate 202 from the back-side redistribution structure 206, e.g., the dielectric layer 208. In accordance with some embodiments, the de-bonding includes projecting a light such as a laser light or an UV light on the release layer 204 so that the release layer 204 decomposes under the heat of the light and the carrier substrate 202 can be removed. The structure may then be flipped over and placed on a tape.

Figure 20:
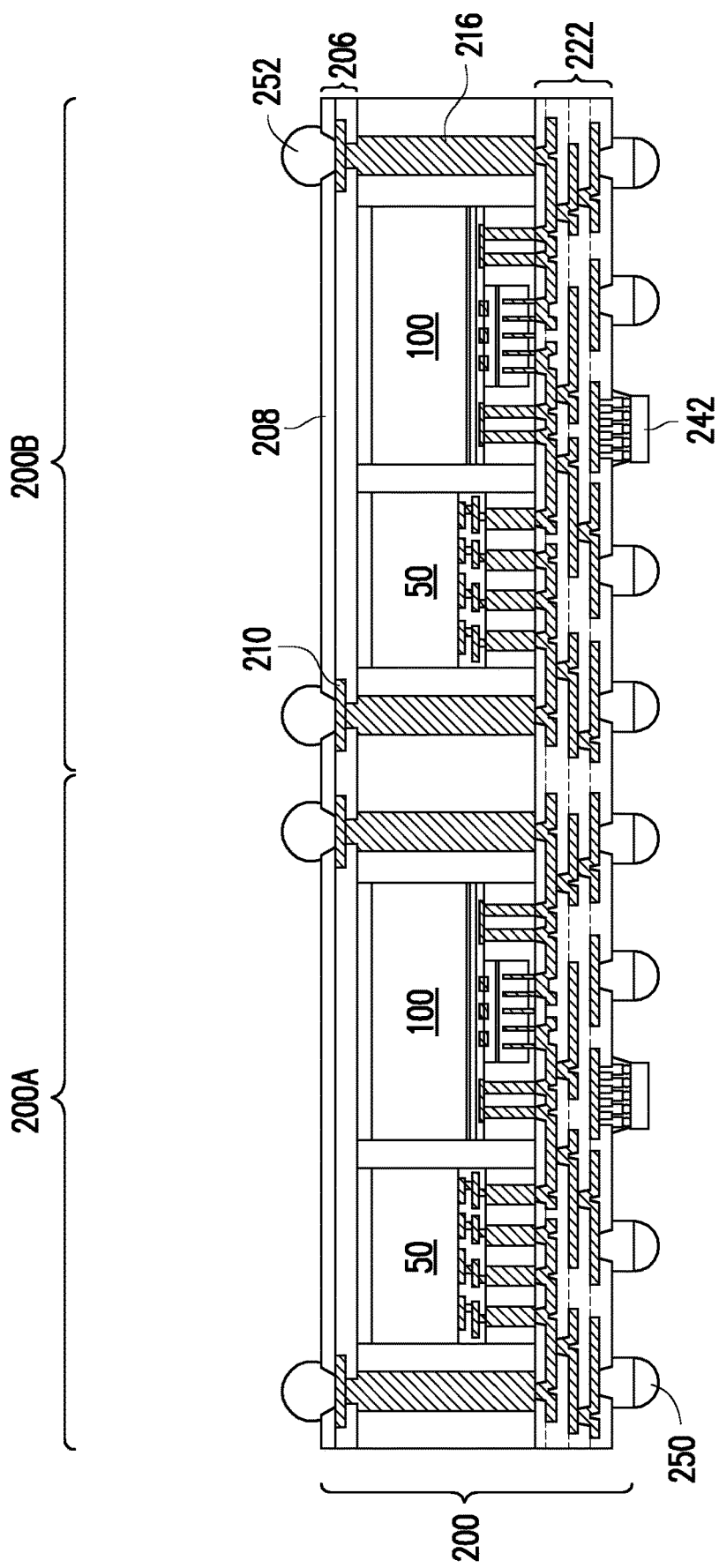

In FIG. 20, conductive connectors 252 are formed extending through the dielectric layer 208 to contact the metallization pattern 210. Openings are formed through the dielectric layer 208 to expose portions of the metallization pattern 210. The openings may be formed, for example, using laser drilling, etching, or the like. The conductive connectors 252 are formed in the openings. In some embodiments, the conductive connectors 252 comprise flux and are formed in a flux dipping process. In some embodiments, the conductive connectors 252 comprise a conductive paste such as solder paste, silver paste, or the like, and are dispensed in a printing process. In some embodiments, the conductive connectors 252 are formed in a manner similar to the conductive connectors 250, and may be formed of a similar material as the conductive connectors 250.

Figure 21:
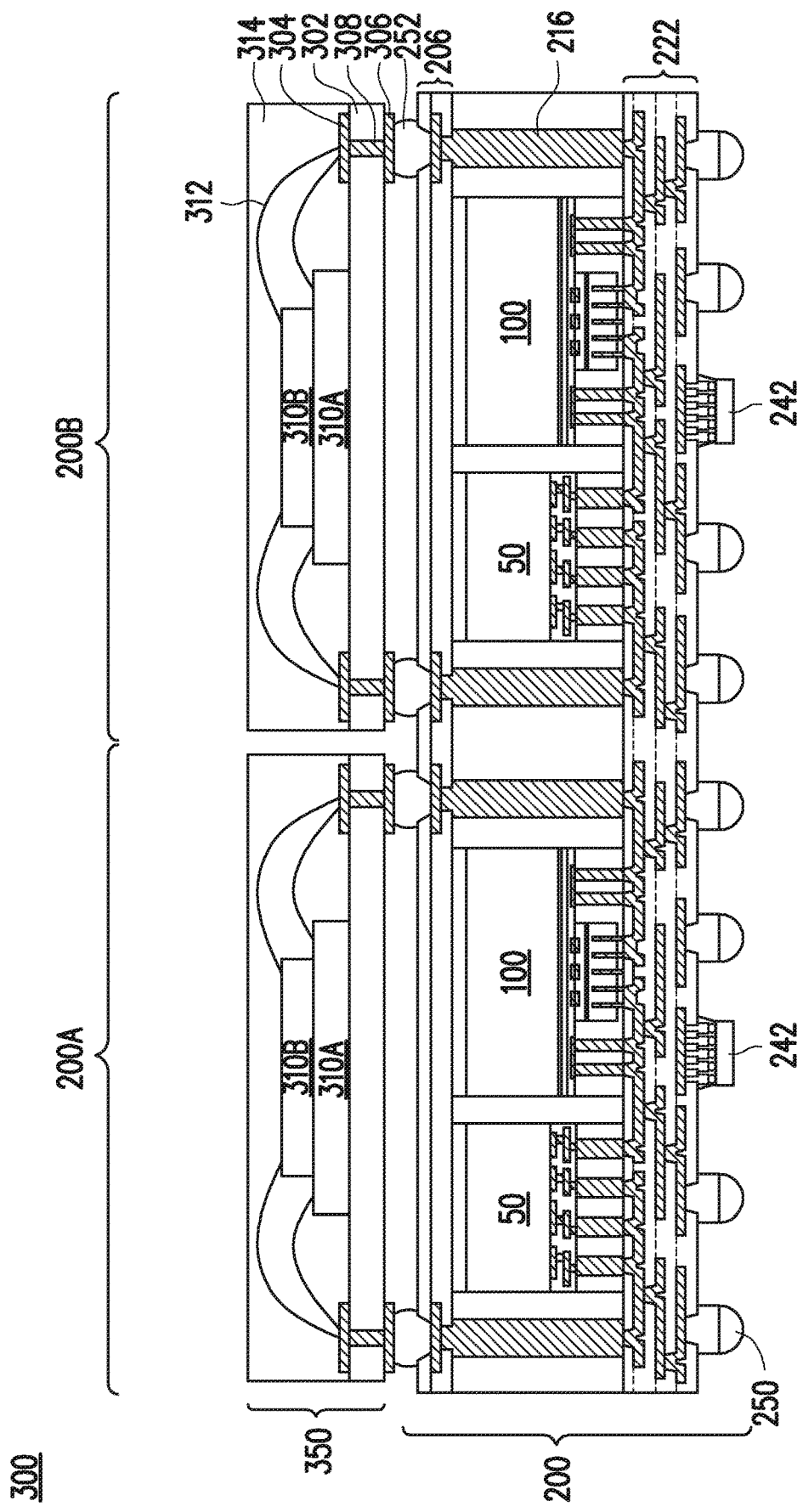
FIGS. 21 through 22 illustrate cross-sectional views of intermediate steps during a process for forming a package, in accordance with some embodiments.
Figure 22:
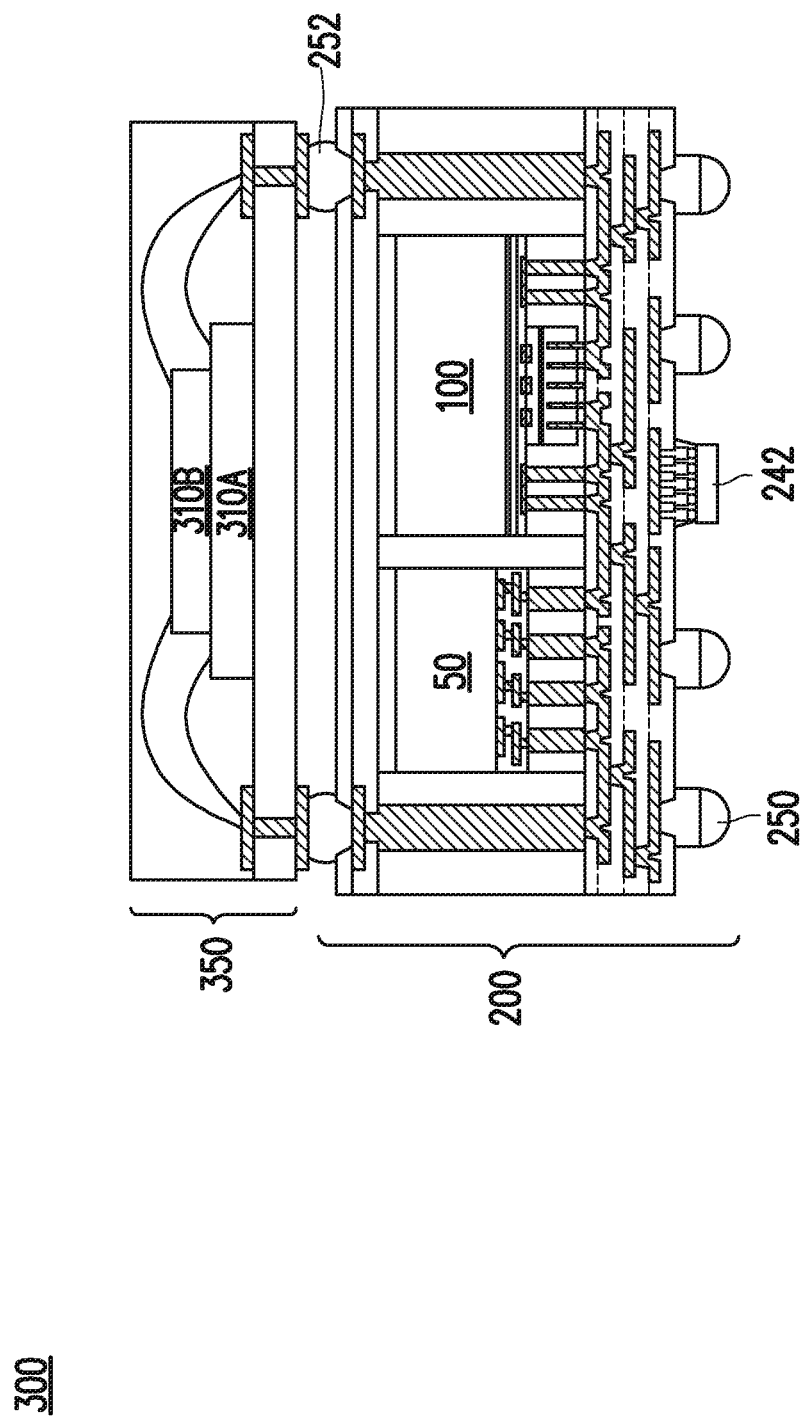

FIGS. 21 and 22 illustrate formation and implementation of packages 300, in accordance with some embodiments. The packages 300 are formed from the integrated circuit packages (e.g., integrated circuit dies 50 and die packages 100) formed in the first package component 200. The packages 300 may also be referred to as package-on-package (PoP) structures or device stacks.

In FIG. 21, second package components 350 are coupled to the first package components 200. One of the second package components 350 are coupled in each of the package regions 200A and 200B to form a device stack in each region of the first package component 200. The second package components 350 include a substrate 302 and one or more stacked dies 310 (e.g., 310A and 310B) coupled to the substrate 302. Although one set of stacked dies 310 (e.g., 310A and 310B) is illustrated, in other embodiments, a plurality of stacked dies 310 (each having one or more stacked dies) may be disposed side-by-side coupled to a same surface of the substrate 302. In an embodiment, the stacked dies 310 are stacked memory dies. For example, the stacked dies 310 may be memory dies such as low-power (LP) double data rate (DDR) memory modules, such as LPDDR1, LPDDR2, LPDDR3, LPDDR4, or the like memory modules.

The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). A wide variety of devices such as transistors, capacitors, resistors, combinations of these, and the like may be used to generate the structural and functional requirements of the design for the second package components 350. The devices may be formed using any suitable methods. The substrate 302 may also include metallization layers (not shown) and conductive vias 308. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 304 on a first side of the substrate 302 to couple to the stacked dies 310, and bond pads 306 on a second side of the substrate 302, the second side being opposite the first side of the substrate 302, to couple to the conductive connectors 252. In some embodiments, the bond pads 304 and 306 are formed by forming recesses (not shown) into dielectric layers (not shown) on the first and second sides of the substrate 302. The recesses may be formed to allow the bond pads 304 and 306 to be embedded into the dielectric layers. In other embodiments, the recesses are omitted as the bond pads 304 and 306 may be formed on the dielectric layer. In some embodiments, the bond pads 304 and 306 include a thin seed layer (not shown) made of copper, titanium, nickel, gold, palladium, the like, or a combination thereof. The conductive material of the bond pads 304 and 306 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 304 and 306 is copper, tungsten, aluminum, silver, gold, the like, or a combination thereof. The bond pads 306 may be referred to as "contact pads," in some cases.

In an embodiment, the bond pads 304 and bond pads 306 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 304 and 306. Any suitable materials or layers of material that may be used for the bond pads 304 and 306 are fully intended to be included within the scope of the current application. In some embodiments, the conductive vias 308 extend through the substrate 302 and couple at least one of the bond pads 304 to at least one of the bond pads 306.

In the illustrated embodiment, the stacked dies 310 are coupled to the substrate 302 by wire bonds 312, although other connections may be used, such as conductive bumps. The stacked dies 310 and the wire bonds 312 may be encapsulated by a molding material 314. The molding material 314 may be molded on the stacked dies 310 and the wire bonds 312, for example, using compression molding. In some embodiments, the molding material 314 is a molding compound, a polymer, an epoxy, silicon oxide filler material, the like, or a combination thereof. A curing process may be performed to cure the molding material 314; the curing process may be a thermal curing, a UV curing, the like, or a combination thereof.

In some embodiments, the stacked dies 310 and the wire bonds 312 are buried in the molding material 314, and after the curing of the molding material 314, a planarization step, such as a grinding, is performed to remove excess portions of the molding material 314 and provide a substantially planar surface for the second package components 350.

After the second package components 350 are formed, the second package components 350 are mechanically and electrically bonded to the first package component 200 by way of the conductive connectors 252, the bond pads 306, and a metallization pattern of the back-side redistribution structure 206. In some embodiments, the stacked dies 310 may be coupled to the integrated circuit dies 50 and the die packages 100 through the wire bonds 312, the bond pads 304 and 306, conductive vias 308, the conductive connectors 252, the back-side redistribution structure 206, the through vias 216, and the front-side redistribution structure 222.

In some embodiments, a solder resist is formed on the side of the substrate 302 opposing the stacked dies 310. The conductive connectors 252 may be disposed in openings in the solder resist to be electrically and mechanically coupled to conductive features (e.g., the bond pads 306) in the substrate 302. The solder resist may be used to protect areas of the substrate 302 from external damage. In some embodiments, the conductive connectors 252 have an epoxy flux (not shown) formed thereon before they are reflowed with at least some of the epoxy portion of the epoxy flux remaining after the second package components 350 are attached to the first package components 200.

In some embodiments, an underfill is formed between the first package component 200 and the second package components 350, surrounding the conductive connectors 252. The underfill may reduce stress and protect the joints resulting from the reflowing of the conductive connectors 252. The underfill may be formed by a capillary flow process after the second package components 350 are attached, or may be formed by a suitable deposition method before the second package components 350 are attached. In embodiments where the epoxy flux is formed, it may act as the underfill.

In FIG. 22, a singulation process is performed by sawing along scribe line regions, e.g., between the first package region 200A and the second package region 200B. The sawing singulates the first package region 200A from the second package region 200B. The resulting singulated package 300 is from one of the first package region 200A or the second package region 200B. In some embodiments, the singulation process is performed after the second package components 350 are coupled to the first package component 200. In other embodiments (not shown), the singulation process is performed before the second package components 350 are coupled to the first package component 200, such as after the carrier substrate 202 is de-bonded and the conductive connectors 252 are formed. In this manner, a package 300 may be formed, in accordance with some embodiments.

The formation of the first package component 200 having an integrated circuit die 50 adjacent to a die package 100 can allow for a smaller size package and a reduced processing cost. Additionally, having the integrated circuit die 50 and the die package 100 attached to the same redistribution structure (e.g., 222) can reduce the routing distance between the integrated circuit die 50 and the die package 100 and thus improve high-speed operation of the package 300. The use of techniques described herein allow for the integrated circuit die 50 and the die package 100 to be connected to the redistribution structure 222 using conductive connectors of different sizes or pitches, which allows for flexibility of design. Additionally, size and cost of a package 300 can be reduced by forming a die package 100 from two or more semiconductor devices 102 that are bonded with a first wafer 120 into a SoIC structure or the like.

Figure 23:
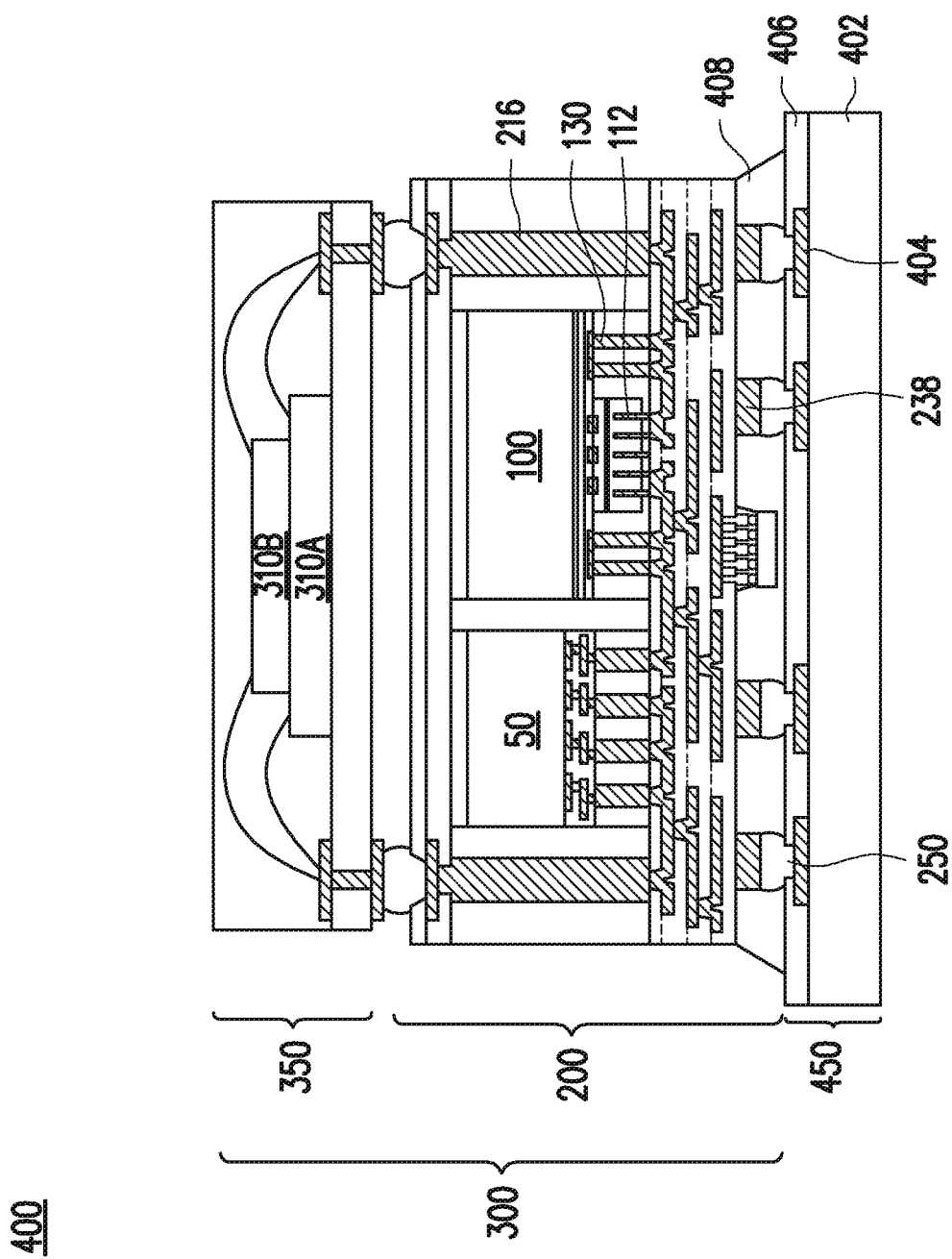
FIG. 23 illustrates a cross-sectional view of an intermediate step during a process for forming a package structure, in accordance with some embodiments.

Turning to FIG. 23, a package 300 is mounted to a package substrate 450 to form a package structure 400, in accordance with some embodiments. The package 300 may be mounted to a package substrate 450 using the conductive connectors 250. The package substrate 450 may include a substrate core 402 and bond pads 404 over the substrate core 402. The substrate core 402 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 402 may be a SOI substrate. Generally, an SOI substrate includes a layer of a semiconductor material such as epitaxial silicon, germanium, silicon germanium, SOI, SGOI, or combinations thereof. The substrate core 402 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 402.

The substrate core 402 may include active and passive devices (not shown). As one of ordinary skill in the art will recognize, a wide variety of devices such as transistors, capacitors, resistors, combinations of these, and the like may be used to generate the structural and functional requirements of the design for the package structure 400. The devices may be formed using any suitable methods.

The substrate core 402 may also include metallization layers and vias (not shown), with the bond pads 404 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 402 is substantially free of active and passive devices.

In some embodiments, the conductive connectors 250 are reflowed to attach the first package component 200 to the bond pads 404. The conductive connectors 250 electrically and/or physically couple the package substrate 450, including metallization layers in the substrate core 402, to the first package component 200. In some embodiments, a solder resist 406 is formed on the substrate core 402. The conductive connectors 250 may be disposed in openings in the solder resist 406 to be electrically and mechanically coupled to the bond pads 404. The solder resist 406 may be used to protect areas of the substrate 402 from external damage.

The conductive connectors 250 may have an epoxy flux (not shown) formed thereon before they are reflowed with at least some of the epoxy portion of the epoxy flux remaining after the first package component 200 is attached to the package substrate 450. This remaining epoxy portion may act as an underfill to reduce stress and protect the joints resulting from the reflowing the conductive connectors 250. In some embodiments, an underfill 408 may be formed between the first package component 200 and the package substrate 450 and surrounding the conductive connectors 250. The underfill 408 may be formed by a capillary flow process after the first package component 200 is attached or may be formed by a suitable deposition method before the first package component 200 is attached.

In some embodiments, passive devices (e.g., surface mount devices (SMDs), not illustrated) may also be attached to the package substrate 450 (e.g., to the bond pads 404). For example, the passive devices may be bonded to a same surface of the package substrate 450 as the conductive connectors 250. The passive devices may be attached to the package substrate 450 prior to or after mounting the first package component 200 on the package substrate 450.

It should be appreciated that the first package component 200 may be implemented in other device stacks, packages, or package structures. For example, a PoP structure is shown, but the first package component 200 may also be implemented in a Flip Chip Ball Grid Array (FCBGA) package. In such embodiments, the first package component 200 is mounted to a substrate such as the package substrate 450, but the second package component 300 is omitted. Instead, a lid or heat spreader may be attached to the first package component 200. When the second package component 350 is omitted, the back-side redistribution structure 206 and through vias 216 may also be omitted.

Figure 24B:
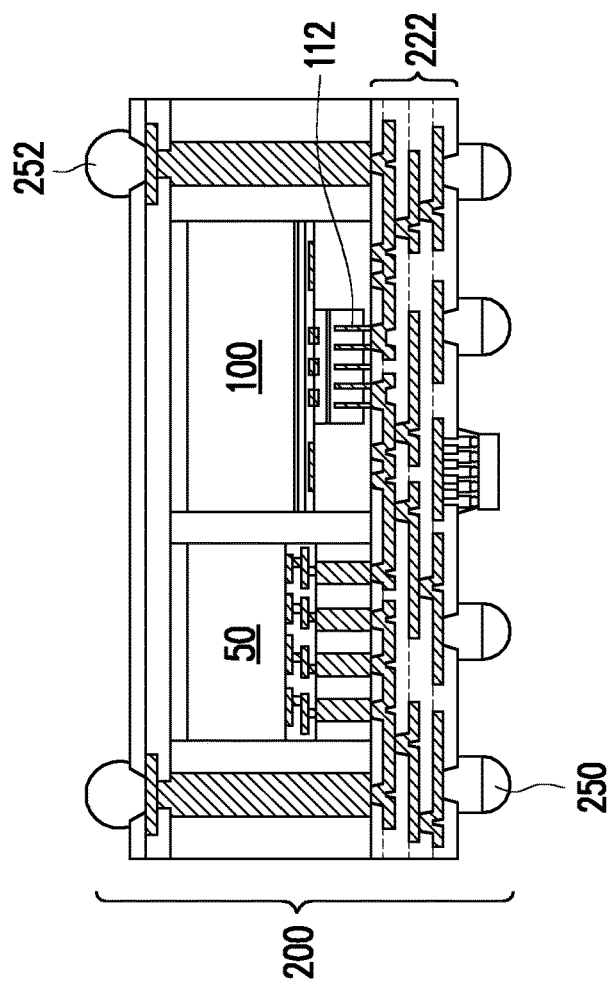
FIGS. 24A, 24B, 25A, 25B, 26, 27A, 27B, 28A, and 28B illustrate cross-sectional views of die packages and packages, in accordance with some embodiments.
Figure 24A:
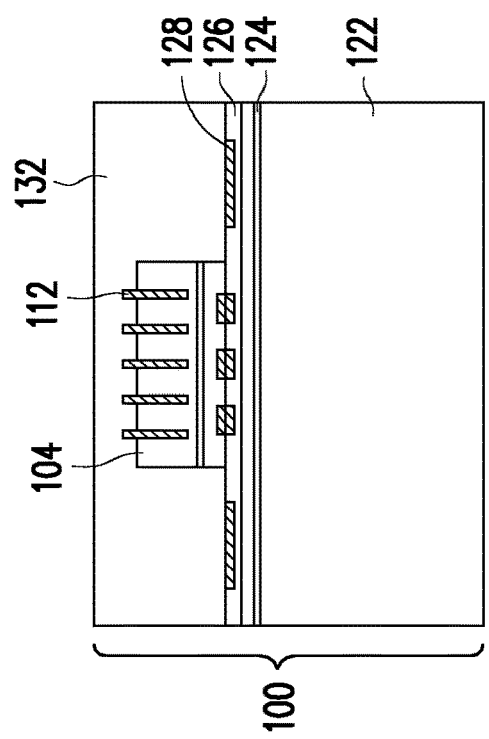

FIGS. 24A-B through 28A-D illustrate additional embodiments of die packages 100 that may be incorporated in first package components 200, packages 300, or package structures 400 such as those described herein. Turning to FIGS. 24A-B, a die package 100 and a first package component 200 are shown. The die package 100 and the first package component 200 are similar to the die package 100 shown in FIG. 6 and the first package component 200 shown in FIG. 20, except that the die package 100 includes TSVs 112 but not TDVs 130. The die package 100 shown in FIGS. 24A-B may be formed in a manner similar to that described in FIGS. 2-6, except the steps forming the TDVs 130 are omitted. In this embodiment, the first wafer 120 is electrically connected to the front-side redistribution structure 222 by the TSVs 112. The first wafer 120 may be connected to the TSVs 112 either directly or indirectly through routing or devices of the semiconductor device 102. The TDVs 130 may be omitted, for example, to save processing costs.

Figure 25B:
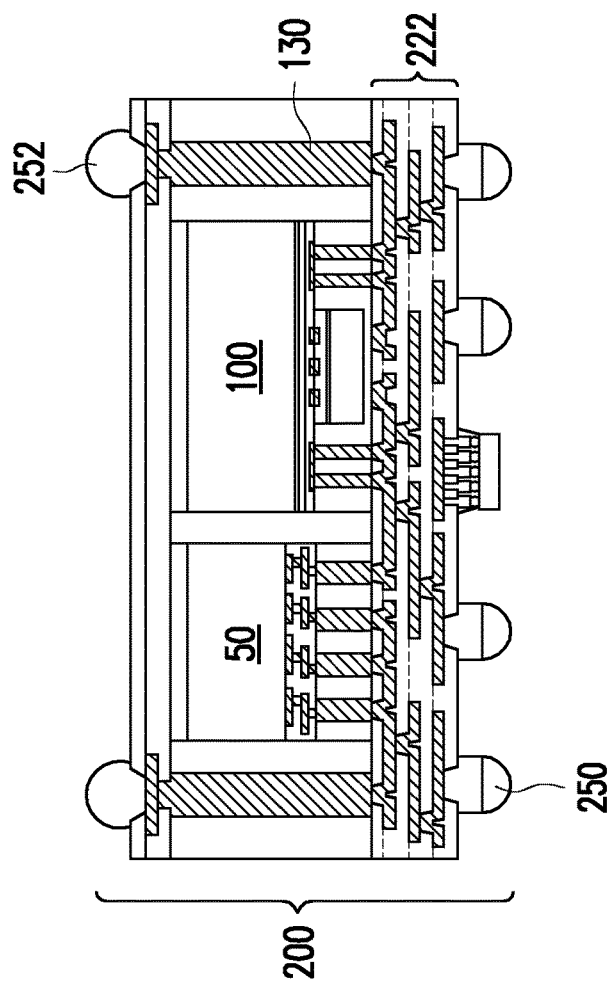
Figure 25A:
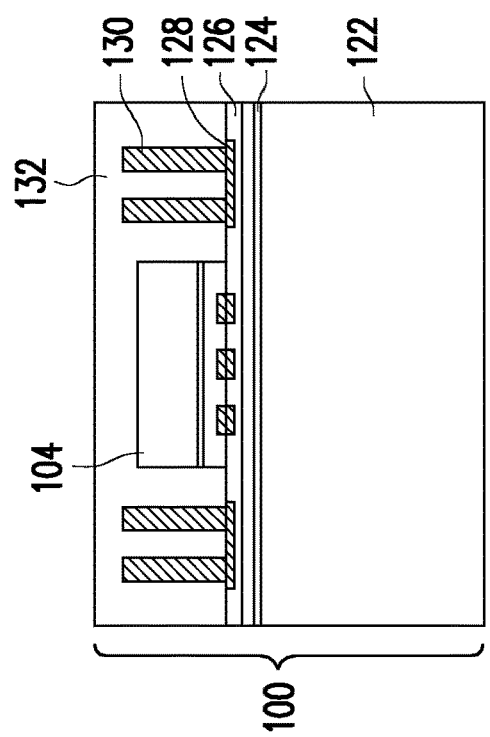

Turning to FIGS. 25A-B, a die package 100 and a first package component 200 are shown. The die package 100 and the first package component 200 are similar to the die package 100 shown in FIG. 6 and the first package component 200 shown in FIG. 20, except that the die package 100 includes TDVs 130 but not TSVs 112. The die package 100 shown in FIGS. 25A-B may be formed in a manner similar to that described in FIGS. 2-6, except the steps forming the TSVs 112 are omitted. In this embodiment, the semiconductor device 102 is electrically connected to the front-side redistribution structure 222 by TDVs 130. The semiconductor device 102 may be connected to the TDVs 130 by the second metallization layer 124 of the first wafer 120, for example. The TSVs 112 may be omitted, for example, to save processing costs.

Figure 26:
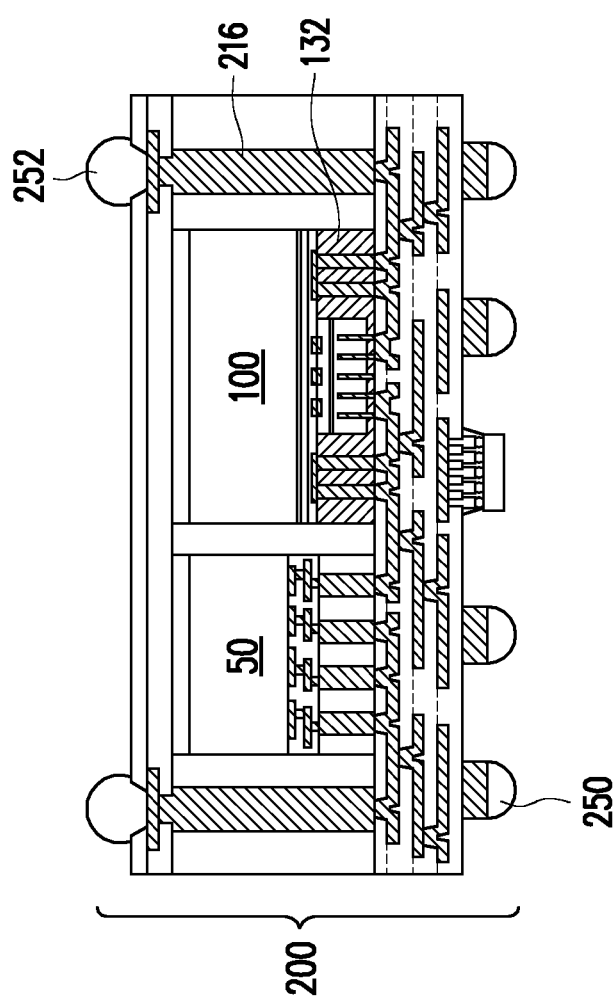

Turning to FIG. 26, a first package component 200 is shown in which the dielectric material 132 of the die package 100 is formed of a molding material or the like, in accordance with some embodiments. The die package 100 and the first package component 200 are similar to the die package 100 shown in FIG. 6 and the first package component 200 shown in FIG. 20, except that the dielectric material 132 of the die package 100 is formed of a molding material or the like. For example, the dielectric material 132 may be formed of a molding material similar to those described above for the encapsulant 220. The dielectric material 132 may be the same type of material as the encapsulant 220, or may be a different material. By forming the dielectric material 132 from a molding material, the die package 100 may have improved structural rigidity and reduced chance of damage during planarization steps. Additionally, the molding material of the dielectric material 132 may be chosen to improve thermal properties of the first package component 200. For example, the molding material of the dielectric material 132 may be chosen to be the same material as the encapsulant 220 so that the coefficient of thermal expansion (CTE) of the dielectric material 132 matches the encapsulant 220. In this manner, problems due to CTE mismatch between the dielectric material 132 and the encapsulant 220 (e.g., cracking, delamination, joint defects, etc.) may be less likely. In some embodiments, the material of the dielectric material 132 may be chosen to have a CTE closer to that of the semiconductor device 102 and/or the first wafer 120 in order to reduce the chance of problems due to CTE mismatch between the dielectric material 132 and the other components of the die package 100. In this manner, the die package 100 or the first package component 200 may be formed of materials suited for a particular application. A dielectric material 132 formed of a molding material may be used with other embodiments described herein.

Figure 27B:
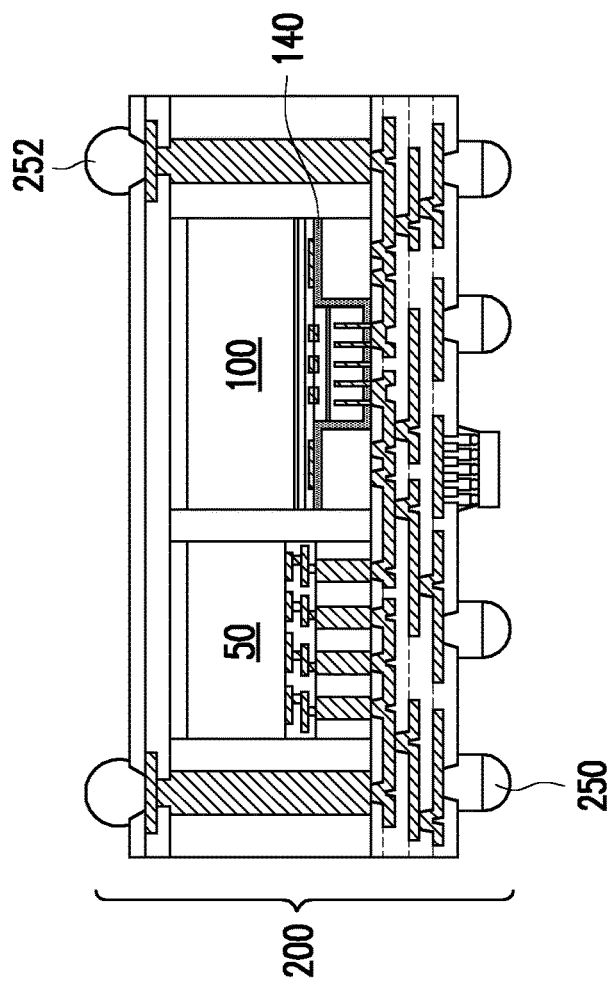
Figure 27A:
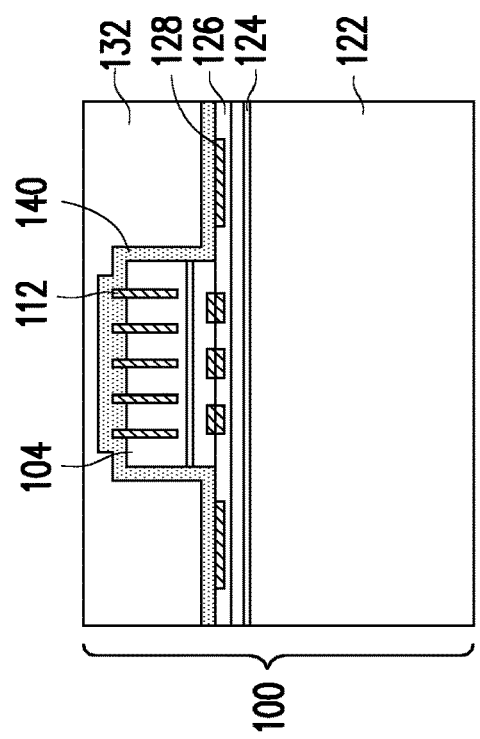

FIGS. 27A-B illustrate a die package 100 and a first package component 200 in which a protective layer 140 is formed within the die package 100. The die package 100 and the first package component 200 are similar to the die package 100 shown in FIG. 24A and the first package component 200 shown in FIG. 24B, except that the die package 100 includes the protective layer 140 formed over the second bond layer 126, the first substrate 104, and the TSVs 112. The die package 100 shown in FIGS. 27A-B may be formed in a manner similar to that described in FIGS. 2-6 and FIGS. 24A-B, except that the protective layer 140 is deposited after the first substrates 104 are recessed, prior to forming the dielectric material 132. The protective layer 140 may be formed of an oxide such as silicon oxide, a nitride such as silicon nitride, silicon carbide, silicon oxycarbide, the like, or combinations thereof. The protective layer 140 may be formed using a deposition process such as CVD, PVD, ALD, or the like. In some embodiments, the protective layer 140 is formed having a thickness between about 0.5 µm and about 3 µm. In some cases, the protective layer 140 can improve the planarity and reduce damage to the semiconductor device 102 during a planarization process, such as during the planarization of the TSVs 112 described for FIG. 12. In some cases, the protective layer 140 can act as a diffusion barrier, reducing diffusion of dopants, ions, atoms, or the like into the semiconductor device 102 or the first wafer 120 during subsequent processing steps. For example, the protective layer 140 can act as a diffusion barrier during the formation of the front-side redistribution structure 222. In this manner, the yield of a first package component 200 may be improved.

Figure 28B:
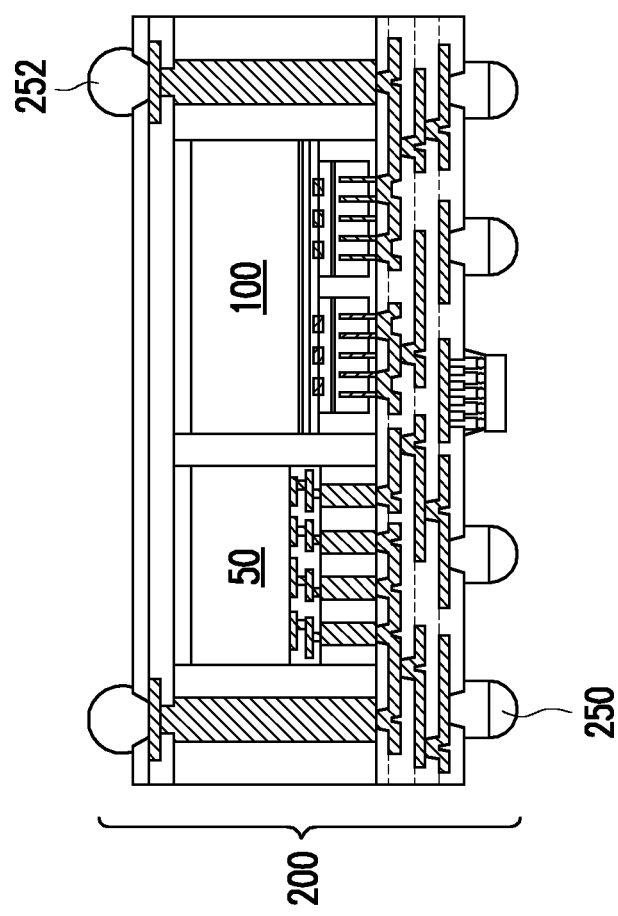
Figure 28A:
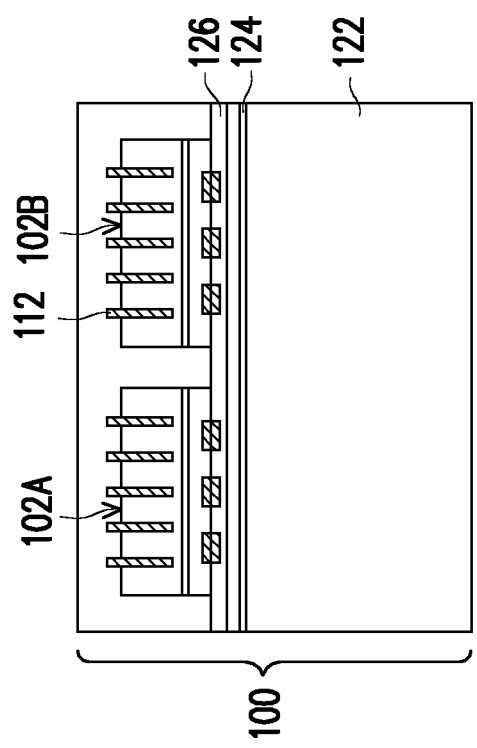

FIGS. 28A-B and 29A-D illustrate the incorporation of multiple semiconductor devices 102 within a single die package 100, in accordance with some embodiments. FIGS. 28A-B illustrate a die package 100 and a first package component 200 in which two semiconductor devices 102A-B are bonded to the first wafer 120. The semiconductor devices 102A-B may be bonded to the first wafer 120 in a manner similar to that described for FIG. 3. For example, the semiconductor devices 102A-B may be bonded using a hybrid bonding process. The semiconductor devices 102A-B may be similar to the semiconductor device 102 described in FIG. 2, in some embodiments. The semiconductor devices 102A-B may be similar semiconductor devices or may be different semiconductor devices, which may have a different size or shape. More than two semiconductor devices 102 may be attached to the first wafer 120 and incorporated into a die package 100 in other embodiments. In some embodiments, TDVs 130 may be formed adjacent one or more of the semiconductor devices 102A-B in a manner similar to that described for FIG. 5. In some embodiments, a TDV 130 may be formed between the two semiconductor devices 102A-B. By bonding multiple semiconductor devices 102 within a die package 100, the size or processing cost of a first package component 200 may be reduced. Additionally, the small separation between the two semiconductor devices 102A-B may improve high-speed operation of the die package 100.

Turning to FIGS. 29A-D, intermediate steps in the formation of a die package 100 that incorporates stacks of semiconductor dies 102A-D are shown, in accordance with some embodiments. The semiconductor devices 102A-D may be similar to the semiconductor device 102 described in FIG. 2, in some embodiments. The semiconductor devices 102A-D may be similar semiconductor devices or may be different semiconductor devices, which may have different sizes or shapes. FIGS. 29A-D show a die package 100 that include four semiconductor devices 102A-D in two stacks having two semiconductor devices each, but the stacks and semiconductor devices may be arranged or configured differently than shown. For example, more or fewer stacks may be formed, more or fewer semiconductor devices may be incorporated within a stack, and stacks may be formed having different numbers of semiconductor devices within the die package 100.

Figure 29A:
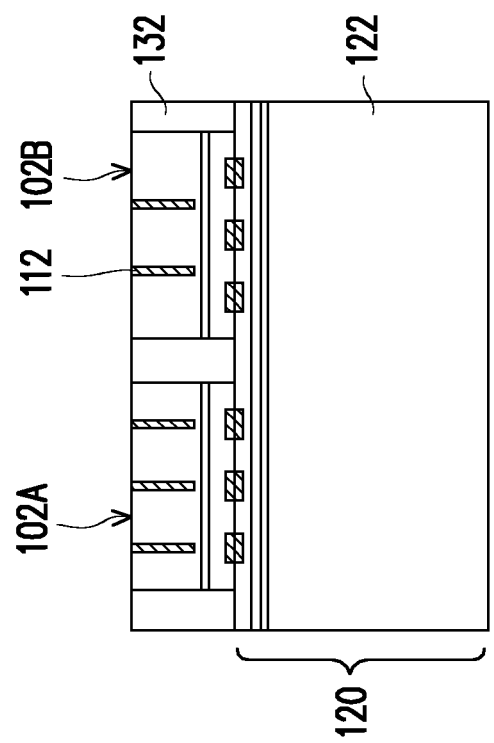
FIG. 29A through 29D illustrate cross-sectional views of die packages, in accordance with some embodiments.
Figure 29B:
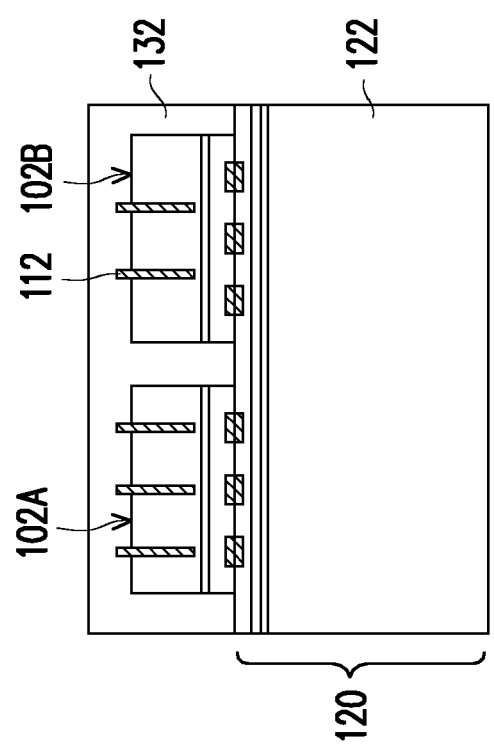

In FIG. 29A, two semiconductor devices 102A and 102B are bonded to the first wafer 120 and covered by the dielectric material 132. The semiconductor devices 102A-B may be bonded to the first wafer 120 in a manner similar to that described for FIG. 3. For example, the semiconductor devices 102A-B may be bonded using a hybrid bonding process. Turning to FIG. 29B, after forming the dielectric material 132, a planarizaton process (e.g., a CMP or the like) is performed to planarize the dielectric material and expose the TSVs 112 of the semiconductor devices 102A-B. The planarization process may be similar to that described for FIG. 12.

Figure 29D:
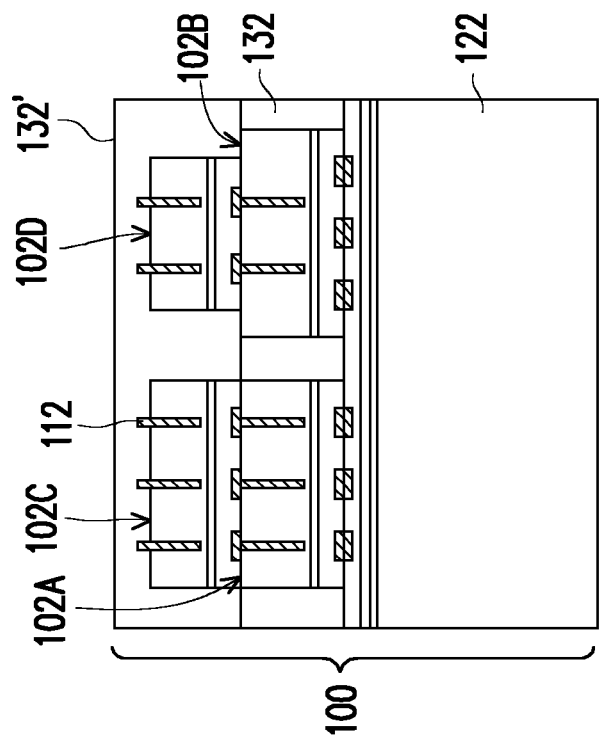
Figure 29C:
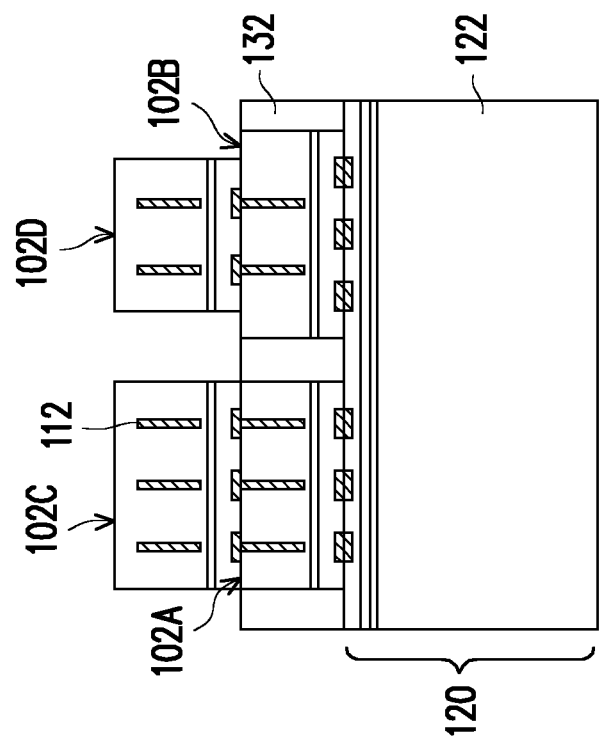

In FIG. 29C, the semiconductor device 102C is bonded to the semiconductor device 102A and the semiconductor device 102D is bonded to the semiconductor device 102B. The semiconductor devices 102C-D may be placed and bonded in a manner similar to that of the semiconductor devices 102A-B. For example, the semiconductor devices 102C-D may be bonded to the semiconductor devices 102A-B using a hybrid bonding process. As shown in FIG. 29C, conductive pads of the semiconductor devices 102C-D may be bonded to TSVs 112 of the semiconductor devices 102A-B to make electrical connections between the semiconductor devices 102C-D and 102A-B. In some cases, the semiconductor devices 102A-D may comprise bonding layers (not individually labeled) at bonding surfaces to facilitate hybrid bonding of the semiconductor devices 102A-D.

In FIG. 29D, the substrates 104 of the semiconductor devices 102C-D are recessed to expose the TSVs 112, and then a dielectric material 132' is formed over the semiconductor devices 102C-D. These process steps may be similar to those described for FIG. 29A. Additional semiconductor devices may be bonded to the semiconductor devices 102C-D using techniques similar to those shown in FIGS. 29A-D. In this manner, a die package 100 may be formed containing one or more stacks of semiconductor devices 102. A die package 100 having stacks of semiconductor devices 102 may be used in a first package component 200, package 300, or package structure 400 described herein, or may be combined with features of other die package 100 embodiments described herein. By forming stacks of semiconductor devices 102 within a die package 100, the size or processing cost of a first package component 200 may be reduced. Additionally, the bonded electrical connections between the semiconductor devices 102 within a stack may improve high-speed operation of the die package 100.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments described herein may achieve advantages. The packages described herein allow for devices of different function or technology to be incorporated, which can increase functionality and reduce cost. By bonding semiconductor devices to form a bonded die package (e.g., a system-on-a-chip (SoC) or the like) within a package, the size of the package may be reduced. The package may include both a bonded die package and another semiconductor die, such as a memory die, I/O die, or the like. The bonded die package and the semiconductor die can be connected to the same redistribution structure, which can allow for shorter routing between the bonded die package and the semiconductor die. The redistribution structure may have vias of different sizes to connect to different devices, such as to through vias of a bonded die package or to contact pads of a semiconductor die. In some cases in which the connections (e.g., through vias or conductive pads) of a device have a relatively small pitch, a single via of the redistribution structure may connect to multiple connections. The use of a bonded die package or shorter routing in this manner may improve high-frequency or high-speed operation of a package. The bonded die package may include multiple semiconductor devices or stacks of semiconductor devices, which can allow for reduced cost and greater flexibility of design. In some cases, the use of different protecting materials within a bonded die package can reduce the chance of defects occurring, for example, due to CTE mismatch or diffusion of dopants into the bonded die package.

In accordance with an embodiment of the present disclosure, a package includes a redistribution structure, a die package on a first side of the redistribution structure, the die package including a first die connected to a second die by metal-to-metal bonding and dielectric-to-dielectric bonding, a first dielectric material over the first die and the second die, wherein the first dielectric material surrounds the first die, and a first through via extending through the first dielectric material, wherein the first through via is connected to the first die, and wherein a first via of the redistribution structure contacts the first through via, a semiconductor device on the first side of the redistribution structure, the semiconductor device including a conductive connector, wherein a second via of the redistribution structure contacts the conductive connector of the semiconductor device, a first molding material on the redistribution structure and surrounding the die package and the semiconductor device, and a package through via extending through the first molding material to contact a third via of the redistribution structure. In an embodiment, the die package further includes a second through via extending through the first dielectric material, wherein the second through via is connected to the second die, and wherein the first via of the redistribution structure contacts the second through via. In an embodiment, the first die is closer to the redistribution structure than the second die. In an embodiment, the die package further includes a third through via extending through the first dielectric material, wherein the third through via is connected to the second die. In an embodiment, the die package further includes a third die connected to the second die, wherein the third die is bonded to the second die by metal-to-metal bonding and dielectric-to-dielectric bonding. In an embodiment, the die package further includes a fourth die connected to the first die, wherein the fourth die is bonded to the first die by metal-to-metal bonding and dielectric-to-dielectric bonding.

In an embodiment, the first dielectric material includes a second molding material. In an embodiment, the second molding material is different than the first molding material. In an embodiment, the package includes a second dielectric material extending over the first die and the second die, wherein the second dielectric material is between the first dielectric material and the second die. In an embodiment, the second dielectric material includes silicon oxycarbide (SiOC).

In accordance with an embodiment of the present disclosure, a semiconductor package, includes a first package component, including a system-on-a-chip (SoC) device including a first semiconductor device bonded to a second semiconductor device, wherein the first semiconductor device includes through silicon vias (TSVs) having a first pitch, wherein the SoC device includes through dielectric vias (TDVs) connected to the second semiconductor device, the TDVs having a second pitch greater than the first pitch, a first semiconductor die comprising conductive connectors having a third pitch that is greater than the first pitch, a first redistribution structure connected to the TSVs and the TDVs of the SoC device and connected to the conductive connectors of the first semiconductor die, an encapsulant on the first redistribution structure, wherein the encapsulant separates the SoC device from the first semiconductor die, and through vias extending through the encapsulant, the through vias connected to the first redistribution structure, and a second package component including a second semiconductor die and contact pads, wherein the contact pads are connected to the through vias of the first package component. In an embodiment, the first semiconductor device includes a first bonding layer and first bond pads, and the second semiconductor device comprises a second bonding layer and second bond pads, wherein the first bonding layer is bonded to the second bonding layer and the first bond pads are bonded to the second bond pads. In an embodiment, the first semiconductor die is a stacked memory die. In an embodiment, the first redistribution structure includes a via portion contacting a first TSV and a second TSV of the first semiconductor device, wherein the via portion extends from the first TSV to the second TSV. In an embodiment, the first semiconductor device has a first area that is smaller than a second area of the second semiconductor device. In an embodiment, the SoC device has the same thickness as the first semiconductor die.

In accordance with an embodiment of the present disclosure, a method includes bonding a first semiconductor device to a wafer using a hybrid bonding process, wherein the first semiconductor device is electrically connected to the wafer after bonding, and wherein the first semiconductor devices includes through substrate vias, exposing the through substrate vias by removing a portion of the first semiconductor device, depositing a dielectric material over the first semiconductor device and the wafer, singulating the wafer to form a die package, attaching the die package and a second semiconductor device to a carrier, forming through vias on the carrier, encapsulating the die package, the second semiconductor device, and the through vias with an encapsulant, thinning the encapsulant to expose the through substrate vias, and forming a first redistribution structure over the encapsulant, wherein the first redistribution structure is electrically connected to the through substrate vias, the second semiconductor device, and the through vias. In an embodiment, the method includes depositing a protection layer over the first semiconductor device and the wafer, wherein the dielectric material is formed over the protection layer. In an embodiment, the method includes bonding a third semiconductor device to the wafer, wherein the die package includes the third semiconductor device. In an embodiment, the dielectric material includes a molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a redistribution structure;
    a die package on a first side of the redistribution structure, the die package comprising:
        a first die connected to a second die by metal-to-metal bonding and dielectric-to-dielectric bonding;
        a first dielectric material over the first die and the second die, wherein the first dielectric material surrounds the first die;
        a second dielectric material extending over the first die and the second die, wherein the second dielectric material is between the first dielectric material and the second die; and
        a first through via extending through the first dielectric material, wherein the first through via is connected to the first die, and wherein a first via of the redistribution structure contacts the first through via;
    a semiconductor device on the first side of the redistribution structure, the semiconductor device comprising a conductive connector, wherein a second via of the redistribution structure contacts the conductive connector of the semiconductor device;
    a first molding material on the redistribution structure and surrounding the die package and the semiconductor device; and
    a package through via extending through the first molding material to contact a third via of the redistribution structure.

2. The package of claim 1, wherein the die package further comprises a second through via extending through the first dielectric material, wherein the second through via is connected to the second die, and wherein the first via of the redistribution structure contacts the second through via.

3. The package of claim 1, wherein the first die is closer to the redistribution structure than the second die.

4. The package of claim 1, wherein the die package further comprises a third through via extending through the first dielectric material, wherein the third through via is connected to the second die.

5. The package of claim 1, wherein the die package further comprises a third die connected to the second die, wherein the third die is bonded to the second die by metal-to-metal bonding and dielectric-to-dielectric bonding.

6. The package of claim 5, wherein the die package further comprises a fourth die connected to the third die, wherein the fourth die is bonded to the third die by metal-to-metal bonding and dielectric-to-dielectric bonding.

7. The package of claim 1, wherein the first dielectric material comprises a second molding material.

8. The package of claim 7, wherein the second molding material is different than the first molding material.

9. The package of claim 1, wherein the second dielectric material comprises silicon oxycarbide (SiOC).

10. The package of claim 1, wherein the second dielectric material has a thickness in the range of 0.5 μm to 3 μm.

11. A semiconductor package, comprising:
   a first package component, comprising:
      a system-on-a-chip (SoC) device comprising a first semiconductor device bonded to a second semiconductor device, wherein the first semiconductor device comprises through silicon vias (TSVs) having a first pitch, wherein the SoC device comprises through dielectric vias (TDVs) connected to the second semiconductor device, the TDVs having a second pitch greater than the first pitch;
      a first semiconductor die comprising conductive connectors having a third pitch that is greater than the first pitch;
      a first redistribution structure connected to the TSVs and the TDVs of the SoC device and connected to the conductive connectors of the first semiconductor die;
      an encapsulant on the first redistribution structure, wherein the encapsulant separates the SoC device from the first semiconductor die; and
      through vias extending through the encapsulant, the through vias connected to the first redistribution structure; and
   a second package component comprising a second semiconductor die and contact pads, wherein the contact pads are connected to the through vias of the first package component.

12. The semiconductor package of claim 11, wherein the first semiconductor device comprises a first bonding layer and first bond pads, and wherein the second semiconductor device comprises a second bonding layer and second bond pads, wherein the first bonding layer is bonded to the second bonding layer and the first bond pads are bonded to the second bond pads.

13. The semiconductor package of claim 11, wherein the first semiconductor die is a stacked memory die.

14. The semiconductor package of claim 11, wherein the first redistribution structure comprises a via portion contacting a first TSV and a second TSV of the first semiconductor device, wherein the via portion extends from the first TSV to the second TSV.

15. The semiconductor package of claim 11, wherein the first semiconductor device has a first area that is smaller than a second area of the second semiconductor device.

16. The semiconductor package of claim 11, wherein the SoC device has the same thickness as the first semiconductor die.

17. A device comprising:
   a die package comprising:
      a first semiconductor device hybrid bonded to a substrate, wherein the first semiconductor device is electrically connected to the substrate, and wherein the first semiconductor device comprises through substrate vias; and
      a dielectric material over the first semiconductor device and the substrate, wherein surfaces of the through substrate vias and the dielectric material are level;
   a first redistribution structure, wherein the die package is attached to the first redistribution structure;
   a second semiconductor device attached to the first redistribution structure, wherein the second semiconductor device is adjacent the die package;
   a through via on the first redistribution structure, wherein the through via is adjacent the die package; and
   an encapsulant surrounding the die package, the second semiconductor device, and the through via, respectively.

18. The device of claim 17 further comprising a protection layer over the first semiconductor device and the substrate, wherein the dielectric material is over the protection layer.

19. The device of claim 17, wherein the die package further comprises a third semiconductor device hybrid bonded to the substrate.

20. The device of claim 17, wherein the dielectric material comprises a molding material.

* * * * *